US008594148B2

(12) United States Patent
Nara

(10) Patent No.: US 8,594,148 B2
(45) Date of Patent: Nov. 26, 2013

(54) PSEUDO RANDOM SIGNAL GENERATING APPARATUS, COMMUNICATIONS SYSTEM, AND IMAGE FORMING SYSTEM

(75) Inventor: Shigeo Nara, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 455 days.

(21) Appl. No.: 12/852,831

(22) Filed: Aug. 9, 2010

(65) Prior Publication Data

US 2011/0200124 A1    Aug. 18, 2011

(30) Foreign Application Priority Data

Feb. 12, 2010    (JP) .................................. 2010-029213

(51) Int. Cl.
*H04B 1/00*    (2006.01)

(52) U.S. Cl.
USPC ............................ 375/130; 375/295; 375/367

(58) Field of Classification Search
USPC ......... 375/130, 213, 367–368, 295, 316, 257, 375/259, 233, 226
See application file for complete search history.

(56) References Cited

U.S. PATENT DOCUMENTS

| | | | | |
|---|---|---|---|---|
| 4,874,184 A | * | 10/1989 | Boyer ......................... | 280/423.1 |
| 5,383,143 A | * | 1/1995 | Crouch et al. ................ | 708/254 |
| 5,563,573 A | * | 10/1996 | Ng et al. ....................... | 338/334 |
| 5,574,733 A | * | 11/1996 | Kim .............................. | 714/728 |
| 5,689,530 A | * | 11/1997 | Honaker, Jr. .................. | 375/286 |
| 5,694,444 A | * | 12/1997 | Bagchi et al. .................. | 377/54 |
| 5,781,742 A | | 7/1998 | Asano et al. | |
| 5,793,988 A | | 8/1998 | Asano et al. | |
| 6,061,818 A | * | 5/2000 | Touba et al. ................... | 714/739 |
| 6,292,911 B1 | * | 9/2001 | Swanson ....................... | 714/715 |
| 6,401,226 B1 | * | 6/2002 | Maeno ........................... | 714/728 |
| 6,490,317 B1 | * | 12/2002 | Huscroft ........................ | 375/224 |
| 6,526,511 B1 | * | 2/2003 | Urano et al. .................. | 713/190 |
| 7,092,906 B1 | * | 8/2006 | Campbell et al. .............. | 705/50 |
| 7,236,594 B2 | * | 6/2007 | Van Veldhoven et al. ...... | 380/46 |
| 7,237,162 B1 | * | 6/2007 | Wohl et al. .................... | 714/726 |
| 7,409,331 B2 | * | 8/2008 | Gupta ............................ | 703/28 |
| 7,801,300 B2 | * | 9/2010 | Fuse et al. ...................... | 380/28 |
| 8,280,044 B2 | * | 10/2012 | Takatsu .......................... | 380/42 |
| 2003/0053626 A1 | * | 3/2003 | Van Veldhoven et al. ...... | 380/46 |
| 2003/0115525 A1 | * | 6/2003 | Hill et al. ...................... | 714/726 |
| 2003/0149922 A1 | * | 8/2003 | Lai ................................. | 714/724 |
| 2004/0088626 A1 | * | 5/2004 | Ichino et al. ................... | 714/738 |
| 2004/0153931 A1 | * | 8/2004 | Cao et al. ....................... | 714/738 |
| 2004/0227714 A1 | * | 11/2004 | Furuichi ......................... | 345/98 |

(Continued)

FOREIGN PATENT DOCUMENTS

JP    A-8-79312    3/1996

*Primary Examiner* — Emmanuel Bayard
(74) *Attorney, Agent, or Firm* — Oliff & Berridge, PLC

(57) ABSTRACT

The present invention provides a pseudo random signal generation circuit including: pattern signal output circuit including N stages of D flip-flops (DFF), and that outputs a pattern signal repeating bit patterns of $2^N-1$ bits from the non-inverting terminal of the final stage DFF; a signal output circuit that outputs a signal expressing the bit pattern length every time $2^N-1$ bits of the pattern signal are output; a selection signal output circuit that, based on the signal expressing the bit pattern length, outputs a selection signal for repeatedly selecting plural terminals, from plural terminals including the non-inverting terminals and the inverting terminals of the pattern signal output circuit, plural terminals at a time; and an output circuit that selects the signals output from the plural terminals according to the selection signal, and outputs the selected signal as a pseudo random signal.

11 Claims, 25 Drawing Sheets

(56) References Cited

U.S. PATENT DOCUMENTS

| | | | |
|---|---|---|---|
| 2005/0071399 A1* | 3/2005 | Bonaccio et al. | 708/250 |
| 2005/0240850 A1* | 10/2005 | Ohwada et al. | 714/738 |
| 2006/0080509 A1* | 4/2006 | Averill et al. | 711/134 |
| 2006/0133468 A1* | 6/2006 | Chen et al. | 375/224 |
| 2006/0155613 A1* | 7/2006 | Foran et al. | 705/27 |
| 2006/0268970 A1* | 11/2006 | Ichiyama et al. | 375/226 |
| 2007/0115974 A1* | 5/2007 | Messenger | 370/389 |
| 2007/0210776 A1* | 9/2007 | Oka | 323/283 |
| 2008/0222474 A1* | 9/2008 | Hiraide et al. | 714/739 |
| 2008/0235544 A1* | 9/2008 | Lai et al. | 714/729 |
| 2011/0167309 A1* | 7/2011 | Rajski et al. | 714/726 |

\* cited by examiner

FIG. 5

| No | A1 | A2 | A3 | A4 | A5 | A6 | A7 |
|---|---|---|---|---|---|---|---|
| 1 | 1 | 1 | 1 | 1 | 1 | 1 | 1 |
| 2 | 0 | 1 | 1 | 1 | 1 | 1 | 1 |
| 3 | 0 | 0 | 1 | 1 | 1 | 1 | 1 |
| 4 | 0 | 0 | 0 | 1 | 1 | 1 | 1 |
| 5 | 0 | 0 | 0 | 0 | 1 | 1 | 1 |
| 6 | 0 | 0 | 0 | 0 | 0 | 1 | 1 |
| 7 | 0 | 0 | 0 | 0 | 0 | 0 | 1 |
| 8 | 1 | 0 | 0 | 0 | 0 | 0 | 0 |
| 9 | 0 | 1 | 0 | 0 | 0 | 0 | 0 |
| 10 | 0 | 0 | 1 | 0 | 0 | 0 | 0 |
| 11 | 0 | 0 | 0 | 1 | 0 | 0 | 0 |
| 12 | 0 | 0 | 0 | 0 | 1 | 0 | 0 |
| 13 | 0 | 0 | 0 | 0 | 0 | 1 | 0 |
| 14 | 1 | 0 | 0 | 0 | 0 | 0 | 1 |
| 15 | 1 | 1 | 0 | 0 | 0 | 0 | 0 |
| 16 | 0 | 1 | 1 | 0 | 0 | 0 | 0 |
| 17 | 0 | 0 | 1 | 1 | 0 | 0 | 0 |
| 18 | 0 | 0 | 0 | 1 | 1 | 0 | 0 |
| 19 | 0 | 0 | 0 | 0 | 1 | 1 | 0 |
| 20 | 1 | 0 | 0 | 0 | 0 | 1 | 1 |

⋮

| 118 | 1 | 0 | 1 | 0 | 0 | 1 | 1 |
|---|---|---|---|---|---|---|---|
| 119 | 0 | 1 | 0 | 1 | 0 | 0 | 1 |
| 120 | 1 | 0 | 1 | 0 | 1 | 0 | 0 |
| 121 | 0 | 1 | 0 | 1 | 0 | 1 | 0 |
| 122 | 1 | 0 | 1 | 0 | 1 | 0 | 1 |
| 123 | 1 | 1 | 0 | 1 | 0 | 1 | 0 |
| 124 | 1 | 1 | 1 | 0 | 1 | 0 | 1 |
| 125 | 1 | 1 | 1 | 1 | 0 | 1 | 0 |
| 126 | 1 | 1 | 1 | 1 | 1 | 0 | 1 |
| 127 | 1 | 1 | 1 | 1 | 1 | 1 | 0 |
| 128 | 1 | 1 | 1 | 1 | 1 | 1 | 1 |

US 8,594,148 B2

PSEUDO RANDOM SIGNAL GENERATING APPARATUS, COMMUNICATIONS SYSTEM, AND IMAGE FORMING SYSTEM

CROSS-REFERENCE TO RELATED APPLICATION

This application is based on and claims priority under 35 USC 119 from Japanese Patent Application No. 2010-029213 filed Feb. 12, 2010.

BACKGROUND

Technical Field

The present invention relates to a pseudo random signal generating apparatus, a communications system, and an image forming system.

SUMMARY

According to an aspect of the invention, there is provided a pseudo random signal generation circuit including: at least one pattern signal output circuit that includes N stages of D flip-flops, wherein N is an integer of 2 or more, the non-inverting terminal of previous stage D flip-flop is connected to the input terminal of the following stage D flip-flop, the non-inverting terminal of final stage D flip-flop and the non-inverting terminal of the D flip-flop of a stage other than the final stage are connected to the input terminal of the first stage D flip-flop through an exclusive-OR circuit, and that outputs a pattern signal repeating bit patterns of $2^N-1$ bits from the non-inverting terminal of the final stage D flip-flop; a signal output circuit that outputs a signal expressing the bit pattern length every time $2^N-1$ bits of the pattern signal are output; a selection signal output circuit that, based on the signal expressing the bit pattern length, outputs a selection signal for repeatedly selecting a plurality of terminals, from a plurality of terminals including the non-inverting terminals and the inverting terminals of the pattern signal output circuit, a plurality of terminals at a time; and an output circuit that selects the signals output from the plurality of terminals according to the selection signal, and outputs the selected signal as a pseudo random signal.

BRIEF DESCRIPTION OF THE DRAWINGS

Exemplary embodiments of the present invention will be described in detail based on the following figures, wherein:

FIG. 5 is a table showing transitions in a pattern signal that is output by a $2^7-1$ bit pattern signal output circuit provided in a pseudo random signal generation circuit;

DETAILED DESCRIPTION

Herebelow, an example of an exemplary embodiment of the present invention will be described in detail with reference to the drawings.

First Exemplary Embodiment

Figure 1:
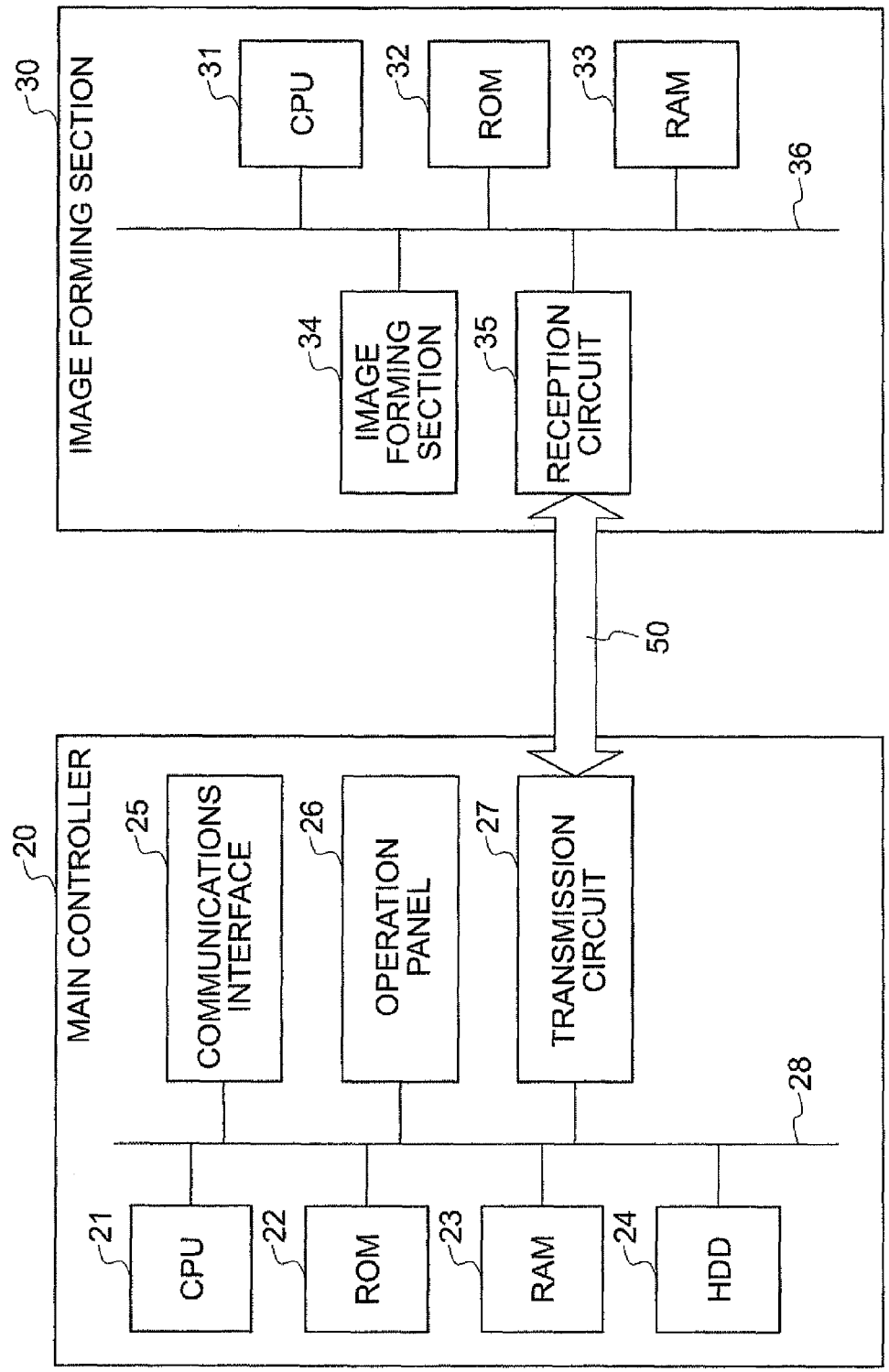
FIG. 1 is a configuration diagram of an image forming system according to a first to a third exemplary embodiment.

FIG. 1 is a configuration diagram of an image forming system according to a first exemplary embodiment.

As shown in FIG. 1, the image forming system according to the first exemplary embodiment is provided with a main controller 20 and an image forming apparatus 30. The main controller 20 and the image forming apparatus 30 are connected together through a serial bus 50.

The image forming system according to the first exemplary embodiment is configured to be switchable between an image forming (normal) mode and a test mode. The image forming (normal) mode is a mode for forming an image in which image data is transmitted to the image forming apparatus 30. The test mode is a mode in which testing of serial transmission through the serial bus 50 is performed.

The image forming system has a normal mode and test mode. The normal mode is a mode in which serial data such as, for example, image data other than test data (a pseudo random signal (Pseudo Random Binary (Bit) Sequence, PRBS)) is transmitted, and normal operation, such as, for example, image forming or the like, is undertaken. The test mode is a mode for checking the transmission state of serial data through the serial bus 50. When in the normal mode, the main controller 20 converts, for example, image data of an image for transmission, or the like, into serial data, and transmits the serial data to the image forming apparatus 30 through the serial bus 50. When in the test mode, the main controller 20 generates a pseudo random signal, and transmits the pseudo random signal to the image forming apparatus 30 through the serial bus 50.

The main controller 20 includes a Central Processor Unit (CPU) 21, Read Only Memory (ROM) 22, Random Access Memory (RAM) 23, a Hard Disk Drive (HDD) 24, a communications interface 25, an operation panel 26, and a transmission circuit 27, with each of these connected together through a system bus 28.

The CPU 21 executes programs stored on the ROM 22 and the HDD 24 (such as, for example, a program for switching between the image forming mode and the test mode, a program for transmitting image data when in the image forming method, and the like). The CPU 21 also controls overall operation of the main controller 20. Stored in the ROM 22 are, for example, the programs for executing by the CPU 21, data required for processing of the CPU 21, and the like. The RAM 23 is employed as a working memory and as an image buffer for temporarily storing image data.

Note that the storage medium for storing programs for execution by the CPU 21 is not limited to the ROM 22 and the HDD 24. The storage medium may be, for example, a floppy disk, a DVD disk, a magneto-optical disk, a CD-ROM or the like (not shown in the figures), or a storage device in another apparatus, connected through the communications interface 25.

The communications interface 25 is connected to communication section (not shown in the figures), and is an interface for performing communication with an external host computer connected to the communication section. The communication section may be, for example, communication lines, either public communications lines or dedicated communications lines, or a network, such as, for example, the Internet, a Local Area Network (LAN), a Wide Area Network (WAN), or the like. The communication section may communicate by wireless or wired.

The operation panel 26 is, for example, configured from a touch panel display, displaying, for example, various information, setting screens and the like, with a user inputting data and command instructions through touch operation. The CPU 21 controls display on the operation panel 26, detects operations to the operation panel 26, and receives instruction data and the like through operation by a user.

The transmission circuit 27 is connected to the serial bus 50. The main controller 20 transmits serial data to the image forming apparatus 30 through the transmission circuit 27.

The image forming apparatus 30 includes a Central Processor Unit (CPU) 31, Read Only Memory (ROM) 32, Random Access Memory (RAM) 33, an image forming section 34, and a reception circuit 35, with each of these connected together through a system bus 36.

The CPU 31 executes programs stored on the ROM 32 (including programs such as, for example, a program to control the image forming section 34 so that an image is formed according to received image data), and controls overall operation of the image forming apparatus 30. In the ROM 32 is stored, for example, programs for execution by the CPU 31, data required for processing of the CPU 31, and the like. The RAM 33 is employed as a working memory and as an image buffer for temporarily storing image data.

The image forming section 34 forms an image based on image data. The image forming section 34 may operate by electrophotographic method, wherein a photoreceptor is charged, the photoreceptor is exposed with light based on image data, the electrostatic latent image generated by this exposure is developed with toner, the developed image is transferred directly, or via an intermediate transfer medium, onto a recording medium, and the transferred image is fixed by a fixing device. The image forming section 34 may also operate by an inkjet method, in which ink droplets are ejected onto a recording medium based on image data. Note that, the image forming method of the present invention is not limited to the above.

The reception circuit 35 is connected to the serial bus 50. The image forming apparatus 30 receives serial data transmitted from the main controller 20 through the reception circuit 35.

Figure 2:
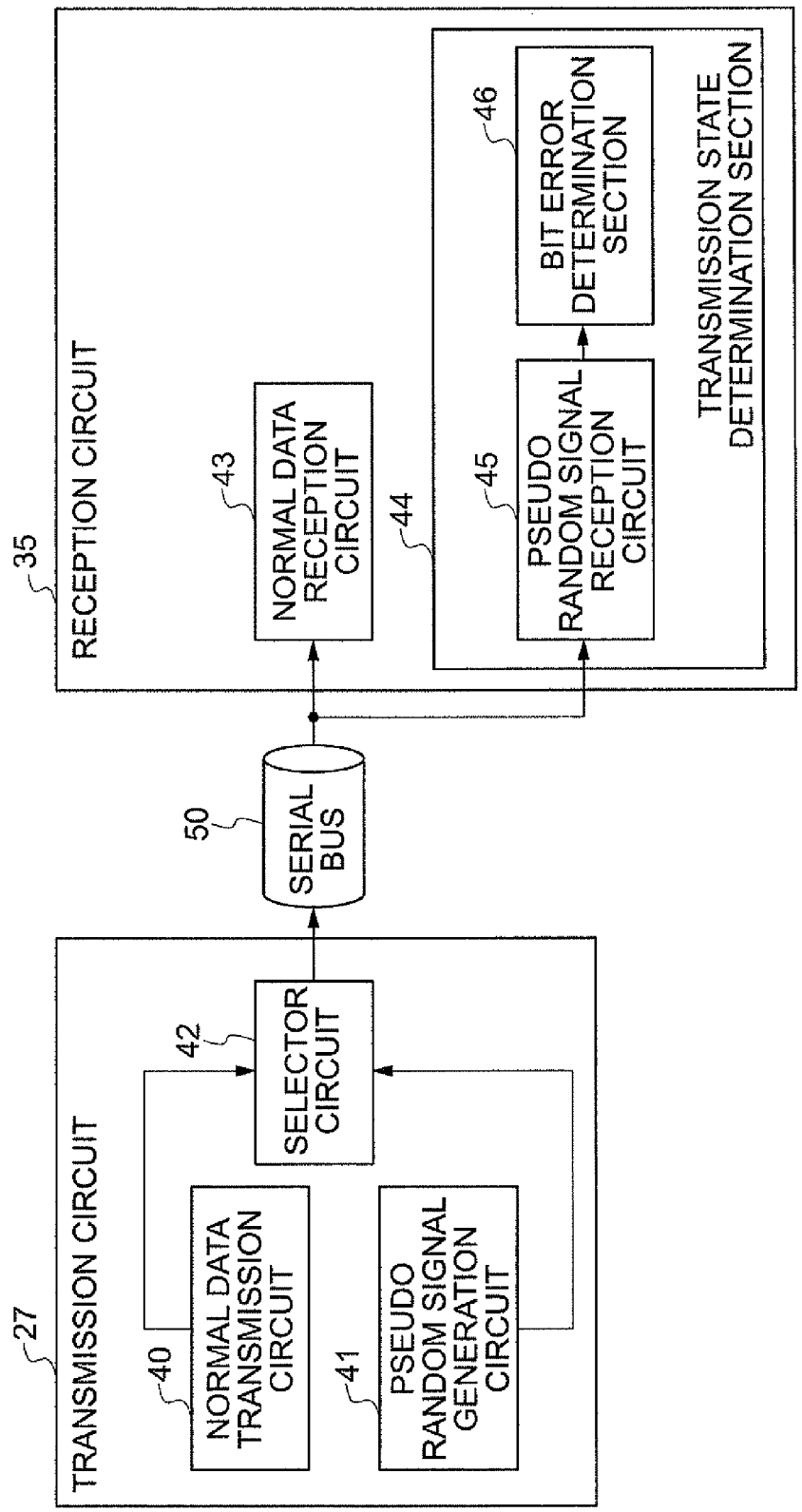
FIG. 2 is a configuration diagram of a transmission circuit provided in a main controller, and an reception circuit provided in a image forming apparatus, according to the first to the third exemplary embodiment.

FIG. 2 is a configuration diagram of the transmission circuit 27 provided in the main controller 20, and the reception circuit 35 provided in the image forming apparatus 30.

The transmission circuit 27 is configured to include a normal data transmission circuit 40, a pseudo random signal generation circuit 41, and a selector circuit 42. The reception circuit 35 is configured to include a normal data reception circuit 43, and a transmission state determination section 44.

In the transmission circuit 27, the normal data transmission circuit 40 is a circuit for transmitting signals (the image data mentioned above, and the like) that require transmission to the reception circuit 35. The pseudo random signal generation circuit 41 is a circuit for generating a pseudo random signal. When in normal mode, the selector circuit 42 selects serial data, such as the image data output from the normal data transmission circuit 40, and transmits the serial data to the serial bus 50. When in test mode, the selector circuit 42 selects a pseudo random signal output from the pseudo random signal generation circuit 41 and transmits this to the serial bus 50. Switching over between the modes of the selector circuit 42 is performed by the CPU 21.

In the reception circuit 35, the normal data reception circuit 43 receives and processes the serial data transmitted from the normal data transmission circuit 40 via the serial bus 50. The transmission state determination section 44 determines the bit error rate, representing the transmission state of the serial signal. The transmission state determination section 44 includes a pseudo random signal reception circuit 45 and a bit error determination section 46. The pseudo random signal reception circuit 45 receives the pseudo random signal that has been output from the pseudo random signal generation circuit 41 and stores the signal in a register (not shown in the figures). The bit error determination section 46 includes a circuit that is the same as the pseudo random signal generation circuit 41 of the transmission circuit 27. The bit error determination section 46 compares the pseudo random signal generated by this circuit with the pseudo random signal received by the pseudo random signal reception circuit 45, and derives the bit error rate indicating the transmission state. The bit error rate may be transmitted from the pseudo random signal reception circuit 45 to the main controller 20 through the pseudo random signal reception circuit 45 using a transmission function (not shown in the figures). The determination result of the bit error rate may be displayed on one or other display device. Setting of the normal data transmission circuit 40 (setting, for example, waveform amplitude and parameters for pre-emphasis, equalizing and the like) may be automatically performed by the CPU 21 of the main controller 20 according to the bit error rate, or may be manually changed by a controller. Note that, while an example is explained of determination of the bit error rate, another characteristic of the reception signal, such as the amplitude or the like, may be determined.

Figure 3:
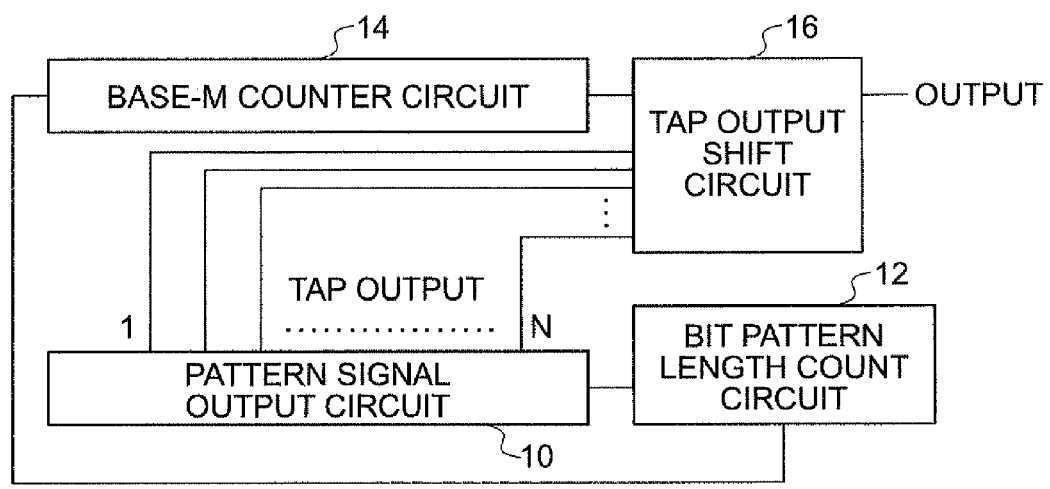
FIG. 3 is a schematic configuration diagram of a pseudo random signal generation circuit according to the first to the third exemplary embodiments.

FIG. 3 is a schematic configuration diagram of the pseudo random signal generation circuit 41.

The pseudo random signal generation circuit 41 includes a pattern signal output circuit 10 provided with a N stages of D flip-flop (wherein N is an integer of 2 or more), a bit pattern length count circuit 12, a base-M counter circuit 14 (wherein M is an integer that is 2 or more, and less than 2N), and a tap output shift circuit 16.

The pattern signal output circuit 10 outputs a pattern signal in which bit patterns of $2^N-1$ bits are repeated.

The bit pattern length count circuit 12 outputs a signal expressing the bit pattern length every time $2^N-1$ bits of the above pattern signal are output.

The base-M counter circuit 14 is equipped with M output terminals. The base-M counter circuit 14 counts the signal expressing the bit pattern length output from the bit pattern length count circuit 12. Then, the base-M counter circuit 14 outputs one or other selection signal every count, such that selection signals of different M individual terminals are repeatedly output M individual terminals at a time.

The tap output shift circuit 16 switches over (selects) the tap (terminal) for output of the pattern signal of the pattern signal output circuit 10, according to the selection signal output from the base-M counter circuit 14. Then the tap output shift circuit 16 outputs the signal output from the selected tap as the pseudo random signal.

Explanation follows of a specific example thereof.

Figure 4:
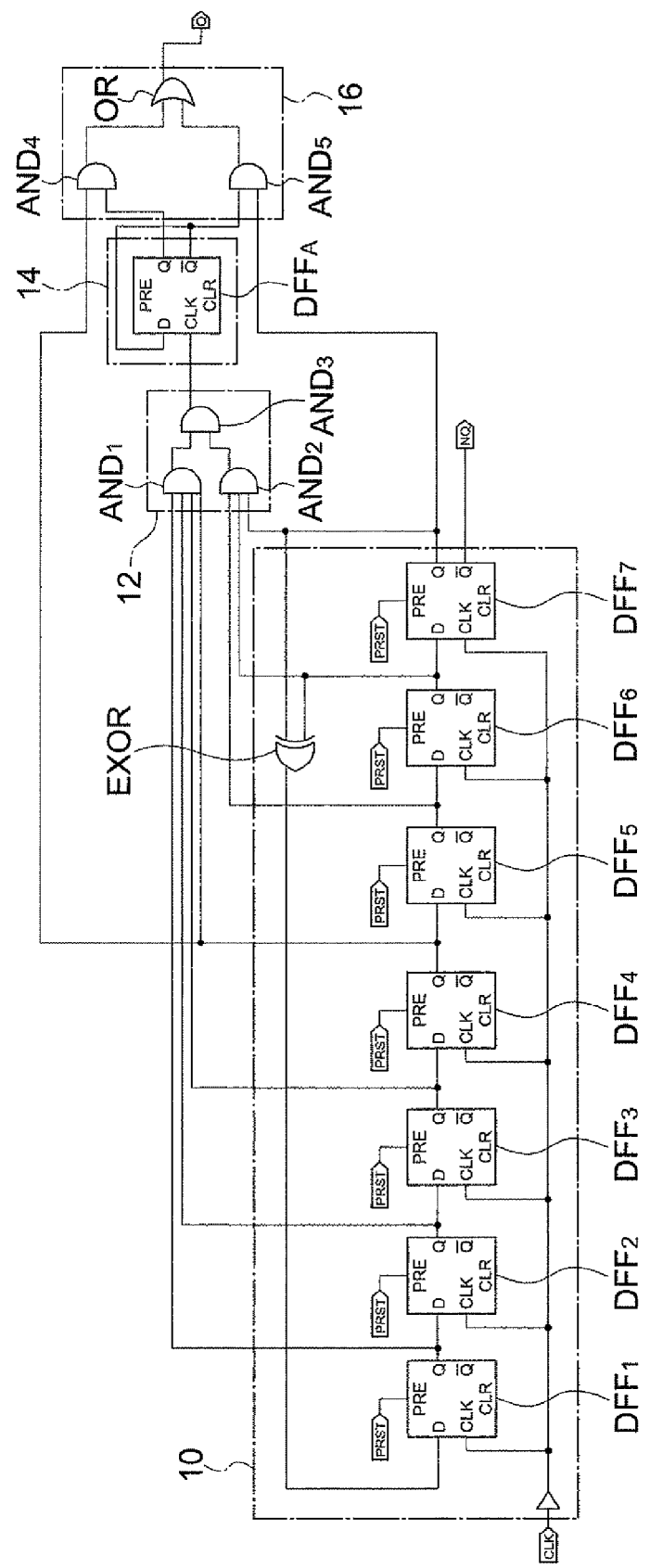
FIG. 4 is a diagram showing an example of a configuration of a pseudo random signal generation circuit with N=7 and M=2.

FIG. 4 is a diagram showing an example of a pseudo random signal generating circuit, with N=7 and M=2, generating a pseudo random signal simulating 7-bit random data.

As shown in FIG. 4, the first exemplary embodiment is provided with the pattern signal output circuit 10 that outputs from the final stage thereof a pattern signal in which bit pattern $2^7-1$ (=127) bits are repeated. The bit pattern length count circuit 12, provided with 3 AND circuits $AND_1$ to $AND_3$, is connected to the pattern signal output circuit 10. The output terminal of the bit pattern length count circuit 12 is connected to an input terminal of a binary counter circuit 14 that serves as a selection signal output circuit and is provided with two output terminals. The output terminals of the binary counter circuit 14 are connected to the tap output shift circuit 16 that switches over the tap for outputting the pseudo random signal and outputs the pseudo random signal.

The pattern signal output circuit 10 is equipped with 7 stages of D flip-flops $DFF_1$ to $DFF_7$. The non-inverting terminal Q of the previous adjacent D flip-flop $DFF_K$ (K=1 to 6) in the D flip-flops $DFF_1$ to $DFF_7$, is connected to the input terminal D of the D flip-flop $DFF_{K+1}$ and the following adjacent stage.

The non-inverting terminal Q of the final stage D flip-flop $DFF_7$ and the non-inverting terminal Q of the D flip-flop $DFF_6$ of one stage previous to the final stage, are connected to the input terminal D of the first stage D flip-flop DFF1 through an exclusive-OR circuit EXOR. A clock signal generator (not shown in the figures) is connected to the clock terminal CLK of each of the respective D flip-flops $DFF_1$ to $DFF_7$, such that a clock signal is input thereto.

As shown in FIG. 5, a pattern signal, in which bit patterns of $2^7-1$ (=127) bits are repeated, is output from the non-inverting terminal Q of the final stage D flip-flop $DFF_7$ of the pattern signal output circuit 10.

The non-inverting terminal Q of the respective D flip-flops $DFF_1$ to $DFF_4$ in the first to the fourth stages of the pattern signal output circuit 10, are connected to the input terminal of the AND circuit $AND_1$ of the bit pattern length count circuit 12. The non-inverting terminal Q of the respective remaining D flip-flops, namely of the D flip-flops $DFF_5$ to $DFF_7$, are connected to the input terminal of the AND circuit $AND_2$. The output terminals of each of the AND circuits $AND_1$ and $AND_2$ are connected to the input terminal of the AND circuit $AND_3$.

Every time high level signals are output from all of the non-inverting terminals Q of the D flip-flops $DFF_1$ to $DFF_7$, a signal expressing the bit pattern length rises to high level, and is output from the AND circuit $AND_3$ of the bit pattern length count circuit 12.

A single D flip-flop $DFF_A$ is provided to the binary counter circuit 14. The non-inverting terminal $Q_A$ and the inverting terminal/$Q_A$ of the D flip-flop $DFF_A$ function as two output terminals.

The output terminal of the AND circuit $AND_3$ of the bit pattern length count circuit 12 is connected to the clock terminal of the D flip-flop $DFF_A$ such that the signal expressing the bit pattern length is input to the clock terminal of the D flip-flop $DFF_A$.

AND circuits $AND_4$ to $AND_5$, these being the same number of circuits as the number of output terminals of the binary counter circuit 14, and an OR circuit OR, are provided in the tap output shift circuit 16.

The non-inverting terminal Q of the fourth stage D flip-flop $DFF_4$ of the pattern signal output circuit 10, and the non-inverting terminal $Q_A$ of the D flip-flop $DFF_A$ of the binary counter circuit 14, are connected to the input terminal of the AND circuit $AND_4$.

The non-inverting terminal Q of the final stage D flip-flop $DFF_7$ of the pattern signal output circuit 10, and the inverting terminal/$Q_A$ of the D flip-flop $DFF_A$ of the binary counter circuit 14, are connected to the input terminal of the AND circuit $AND_5$.

The output terminals of the AND circuits $AND_4$ to $AND_5$ are connected to the input terminal of the OR circuit OR.

According to the pseudo random signal generation circuit 41 of the first exemplary embodiment, the signal output from each of the non-inverting terminals Q of the D flip-flops $DFF_1$ to $DFF_7$ of the pattern signal output circuit 10, is input to the respective input terminal of the AND circuits $AND_1$, $AND_2$ of the bit pattern length count circuit 12. When high level signals are output from all of the non-inverting terminals Q of the D flip-flops $DFF_1$ to $DFF_7$, high level signals are output from the output terminals of the AND circuits $AND_1$, $AND_2$. Consequently, a high level signal is output from the AND circuit $AND_3$.

A pattern signal, of $2^7-1$ bit pattern length, is repeatedly output from the non-inverting terminal Q of the D flip-flop $DFF_7$. However, when this pattern signal is being repeatedly output, a high level signal is output every $2^7-1$ bits from all of the non-inverting terminals Q of the respective D flip-flops $DFF_1$ to $DFF_7$. Consequently, a signal expressing the bit pattern length rising to high level is output from the AND circuit $AND_3$ of the bit pattern length count circuit 12 every time $2^7-1$ bits worth of a signal, corresponding to the pattern length of the pattern signal, is output from the non-inverting terminal Q of the D flip-flop $DFF_7$.

The signal expressing the pattern length output from the AND circuit $AND_3$ is input to the clock terminal CLK of the D flip-flop $DFF_4$ of the binary counter circuit 14. Consequently, every time the signal expressing the bit pattern length output from the bit pattern length count circuit 12 rises to the high level, 4 types of combination signals of combinations of high level and low level shown in Table 1, are repeatedly output from the respective non-inverting terminal $Q_4$ and inverting terminal/$Q_4$ of the binary counter circuit 14. Note that in Table 1, high level is denoted by 1 and low level is denoted by 0.

TABLE 1

| $Q_4$ | 1 | 0 |
|---|---|---|
| /$Q_4$ | 0 | 1 |

Every time a high level signal is output from all of the non-inverting terminals of the D flip-flops $DFF_1$ to $DFF_7$, the signal expressing the bit pattern length output from the bit pattern length count circuit 12 rises to high level. Therefore, when the non-inverting terminal $Q_4$ of the binary counter circuit 14 is at a high level, this high level signal is input to the AND circuit $AND_4$ as a selection signal. The signal output from the non-inverting terminal Q of the D flip-flop $DFF_4$ is also input to the AND circuit $AND_4$. Consequently, the signal output from the non-inverting terminal Q of the D flip-flop $DFF_4$ is output through the AND circuit $AND_4$ and the OR circuit OR as the pseudo random signal, every time the selection signal is at high level. The pseudo random signal output from the non-inverting terminal Q of the D flip-flop $DFF_4$ is output continuously until the next rise in the signal expressing bit pattern length, namely, for 127 bits worth of output.

Similarly, when a high level signal (selection signal) is output from the inverting terminal/$Q_4$ of the binary counter circuit 14, the signal output from the non-inverting terminal Q of the D flip-flop $DFF_7$ is selected. The pseudo random signal output from the non-inverting terminal Q of the D flip-flop $DFF_7$ is output through the AND circuit $AND_5$ and the OR circuit OR every time the signal from the non-inverting terminal Q of the D flip-flop $DFF_7$ is high level.

The pseudo random signals described above are output in sequence from different taps of the pattern signal output circuit 10, according to the respective 2 type combination signals shown in Table 1, namely according to the selection signal. Since these pseudo random signals are output from different respective taps, their respective patterns are different from each other.

These different pattern pseudo random signal are repeatedly output every time selected according to the 2 type combination signals. As a result, the non-inverting terminal Q of the fourth stage D flip-flop $DFF_4$ and the non-inverting terminal Q of the final stage D flip-flop $DFF_7$ are selected alternately. This results in the bit pattern length of the pseudo random signal of the first exemplary embodiment being 127×2=254 bits, and a pseudo random signal is output in which bit patterns of 254 (($2^N-1$)×M, wherein N=7 and M=2) bits are repeated.

Note that configuration is made here such that, the signal output from the non-inverting terminal Q of the D flip-flop $DFF_4$, and the signal output from the non-inverting terminal Q of the D flip-flop $DFF_7$, are selected and output, according to the selection signal. However, the present invention is not limited thereto. In the first exemplary embodiment, a binary counter is employed at the selection signal output circuit. Consequently, selection may be made of signals output from any two different terminals from among the non-inverting terminals Q and the inverting terminals/Q of the respective D flip-flops $DFF_1$ to $DFF_7$ configuring the pattern signal output circuit 10.

Figure 6:
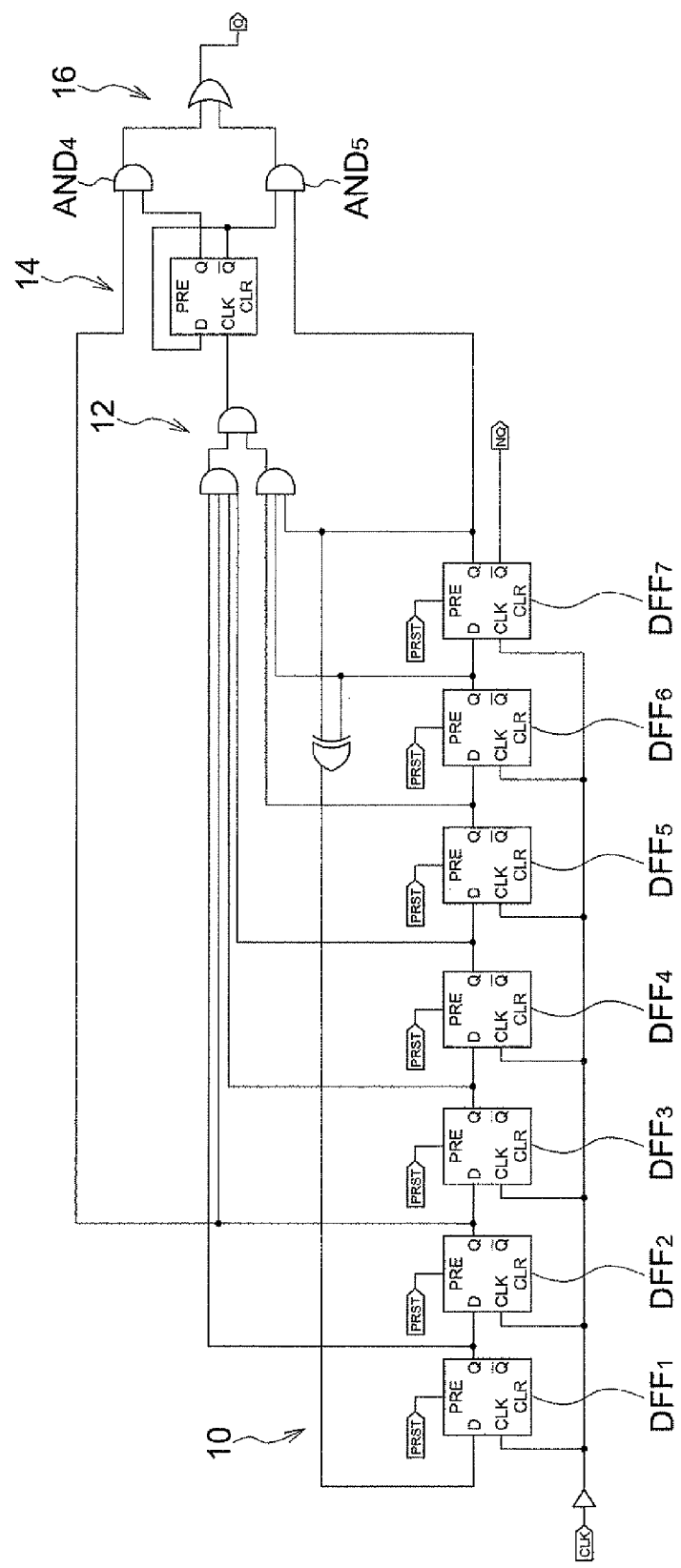
FIG. 6 is a diagram showing an example of a configuration of a pseudo random signal generation circuit with N=7 and M=2.

Consequently, for example in an alternative exemplary embodiment, as shown in FIG. 6, in place of the fourth stage non-inverting terminal Q of the D flip-flop $DFF_4$ of the pattern signal output circuit 10, the non-inverting terminal Q of the second stage D flip-flop $DFF_2$ of the pattern signal output circuit 10 may be connected to one of the input terminals of the AND circuit $AND_4$ of the tap output shift circuit 16. In this alternative exemplary embodiment, the non-inverting terminal Q of the second stage D flip-flop $DFF_2$ and the non-inverting terminal Q of the final stage D flip-flop $DFF_7$ can be selected one after the other by such a configuration.

Figure 7:
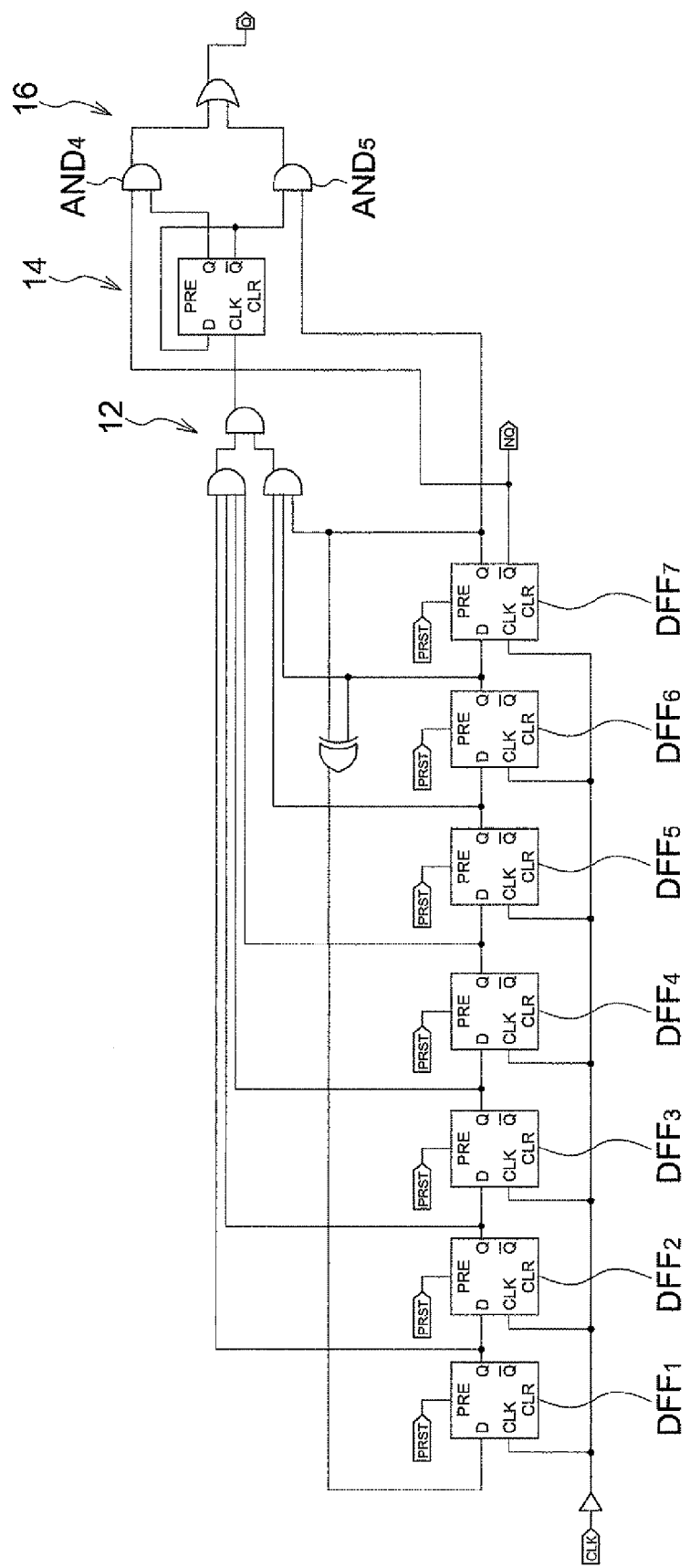
FIG. 7 is a diagram showing an example of a configuration of a pseudo random signal generation circuit with N=7 and M=2.

In a further alternative exemplary embodiment, as shown in FIG. 7, in place of the non-inverting terminal Q of the fourth stage D flip-flop $DFF_4$ of the pattern signal output circuit 10, the inverting terminal/Q of the non-inverting terminal Q of the final stage D flip-flop $DFF_7$ of the pattern signal output circuit 10 may be connected to one of the input terminals of the AND circuit $AND_4$ of the tap output shift circuit 16. In this further alternative exemplary embodiment, the inverting terminal/Q of the final stage D flip-flop $DFF_7$ and the non-inverting terminal Q of the final stage D flip-flop $DFF_7$ can be selected one after the other by such a configuration.

Figure 8:
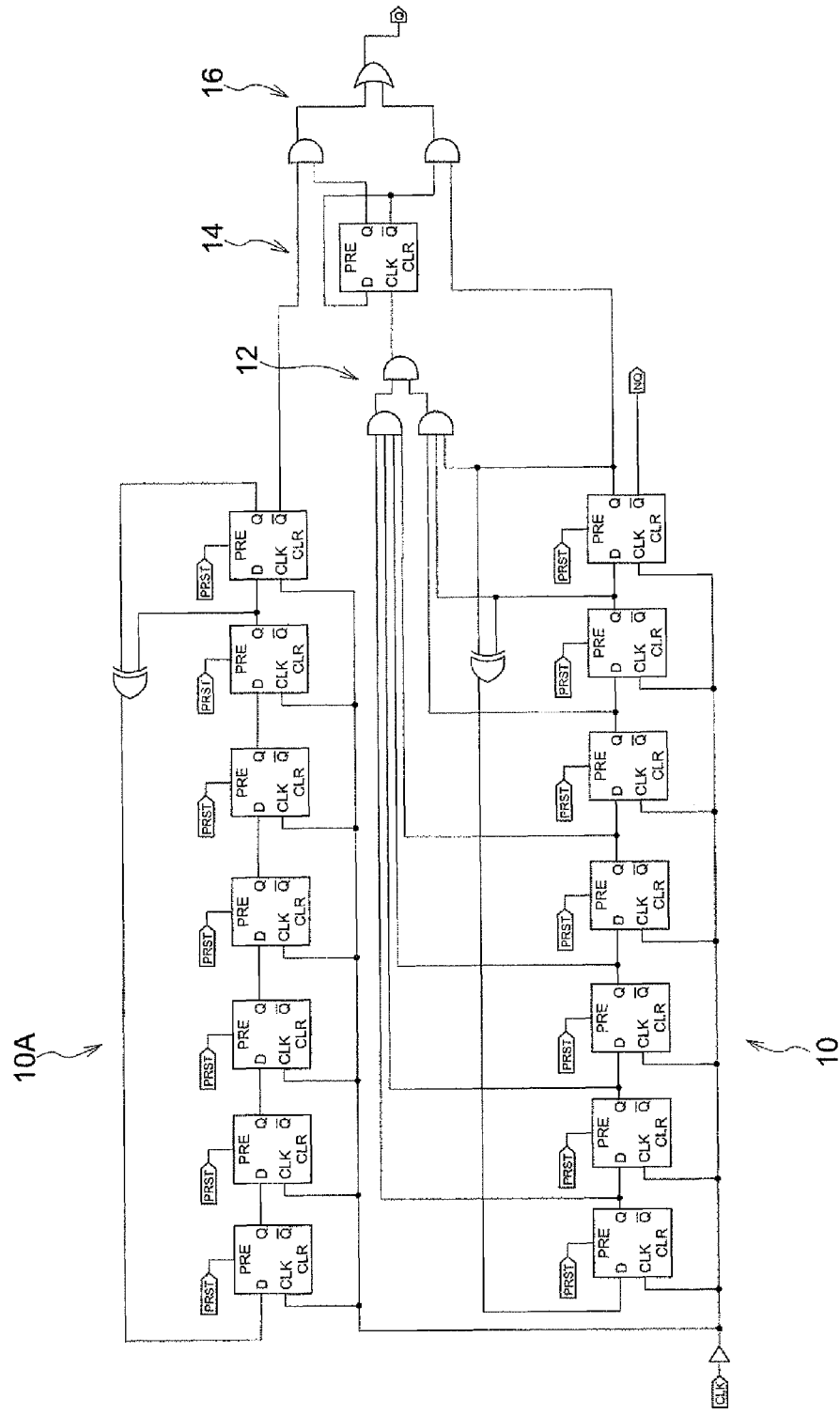
FIG. 8 is a diagram showing an example of a configuration of a pseudo random signal generation circuit with N=7 and M=2.

Two pattern signal output circuits may be employed, the same as in FIG. 7. For example, in a further alternative exemplary embodiment, as shown in FIG. 8, a pattern signal output circuit 10A may be provided, having the same configuration as the pattern signal output circuit 10. The inverting terminal/Q of the final stage D flip-flop $DFF_7$ of the pattern signal output circuit 10A, and the non-inverting terminal $Q_4$ of the D flip-flop $DFF_4$ of the binary counter circuit 14, may be respectively connected to the input terminals of the AND circuit $AND_4$ of the tap output shift circuit 16. Configuration may also be made with the non-inverting terminal Q of the final stage D flip-flop $DFF_7$ of the pattern signal output circuit 10 and the inverting terminal/Q of the D flip-flop $DFF_4$ of the binary counter circuit 14 connected to the input terminals of the AND circuit $AND_5$. In this further alternative exemplary embodiment, the inverting terminal/Q of the final stage D flip-flop $DFF_7$ of the pattern signal output circuit 10A and the non-inverting terminal Q of the final stage D flip-flop $DFF_7$ of the pattern signal output circuit 10 can be selected one after the other by such a configuration.

Note that, in the further alternative exemplary embodiment shown in FIG. 8, the non-inverting terminals Q of the D flip-flops $DFF_1$ to $DFF_4$ in the first to the fourth stages of the pattern signal output circuit 10 are respectively connected to the input terminal of the AND circuit AND of the bit pattern length count circuit 12. Furthermore, the non-inverting terminals Q of the remaining D flip-flops, namely, of the D flip-flops $DFF_5$ to $DFF_7$, are connected to the input terminal of the AND circuit $AND_2$. However, the non-inverting terminals Q of the recording head D flip-flops $DFF_1$ to $DFF_4$ in the first to the fourth stages of the pattern signal output circuit 10A may be connected to the input terminal of the AND circuit $AND_1$, and the non-inverting terminals Q of the D flip-flops $DFF_5$ to $DFF_7$ of the pattern signal output circuit 10A may be connected to the input terminal of the AND circuit $AND_2$.

Second Exemplary Embodiment

In the first exemplary embodiment, cases are explained where the pseudo random signal generation circuit 41 is configured employing a binary counter as the selection signal output circuit. However, the present invention is not limited thereto. For example, the pseudo random signal generation circuit 41 may be configured employing a quaternary counter.

In the second exemplary embodiment, explanation follows of an example in which N=7 and M=4, and a pseudo random signal generating circuit generates a pseudo random signal simulating 7-bit random data. Since the overall configuration diagram thereof is similar to the configuration explained in relation to the first exemplary embodiment, using FIG. 1 to FIG. 3, further explanation thereof is omitted.

Figure 9:
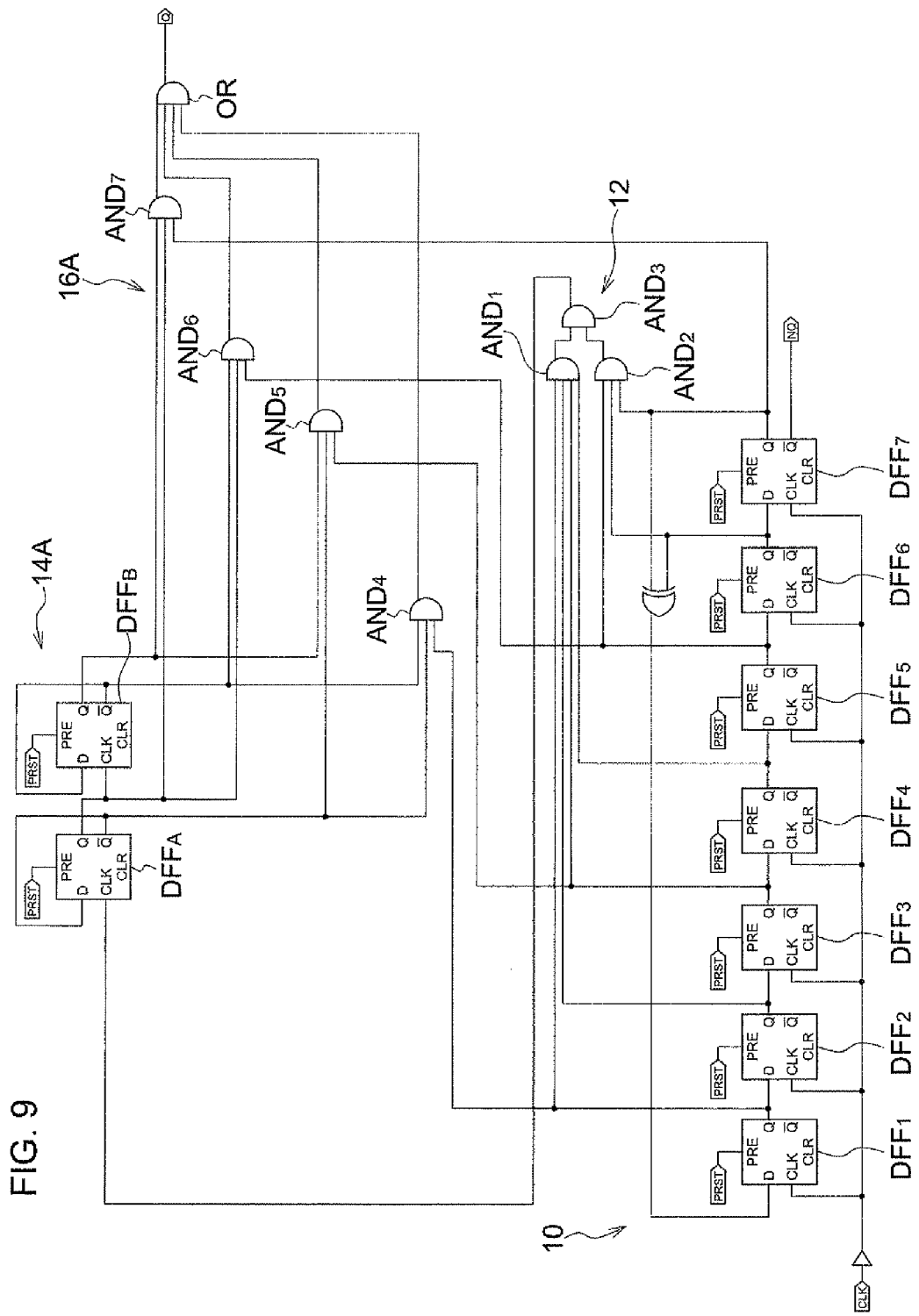
FIG. 9 is a diagram showing an example of a configuration of a pseudo random signal generation circuit with N=7 and M=4.

As shown in FIG. 9, in the second exemplary embodiment, similarly to the pseudo random signal generation circuit 41 of the first exemplary embodiment, a pattern signal output circuit 10 is provided that outputs from the final stage a pattern signal that has a repeating bit pattern of $2^7-1$ (=127) bits. A bit pattern length count circuit 12, provided with 3 AND circuits $AND_1$ to $AND_3$, is connected to the pattern signal output circuit 10. The output terminal of the bit pattern length count circuit 12 is connected to the input terminal of a quaternary counter circuit 14A (the letter A is appended as a suffix in order to differentiate from the binary counter circuit of the first exemplary embodiment), serving as a selection signal output circuit provided with 4 output terminals. Each of the output terminals of the quaternary counter circuit 14A is connected to a tap output shift circuit 16A (the letter A is appended as a suffix in order to differentiate from the tap output shift circuit 16 of the first exemplary embodiment) that switches over the tap for outputting a pseudo random signal, and outputs the pseudo random signal.

Since the pattern signal output circuit 10 and the bit pattern length count circuit 12 are of a similar configuration to that of the first exemplary embodiment, further explanation thereof is omitted.

Two D flip-flops $DFF_A$, $DFF_B$ are provided to the quaternary counter circuit 14A. The non-inverting terminal $Q_A$ and the inverting terminal/$Q_A$ of the D flip-flop $DFF_A$, and the non-inverting terminal $Q_B$ and the inverting terminal/$Q_B$ of the D flip-flop $DDF_B$, function as four output terminals, respectively.

The output terminal of the AND circuit $AND_3$ of the bit pattern length count circuit 12 is connected to the clock terminal of the D flip-flop $DFF_A$ such that a signal expressing the bit pattern length is input thereto.

The non-inverting terminal $Q_A$ of the D flip-flop $DFF_A$ is connected to the clock terminal CLK of the D flip-flop $DFF_B$. The inverting terminal/$Q_A$ of the D flip-flop $DFF_A$ is connected to the input terminal D of the D flip-flop $DFF_A$. The inverting terminal/$Q_B$ of the D flip-flop $DFF_B$ is also connected to the input terminal D of the D flip-flop $DFF_B$, similarly to the D flip-flop $DFF_A$.

AND circuits $AND_4$ to $AND_7$ that are the same number of circuits as the number of output terminals of the quaternary counter circuit 14A, and an OR circuit OR are provided to the tap output shift circuit 16A.

The non-inverting terminal Q of the first stage D flip-flop $DFF_1$ of the pattern signal output circuit 10, the inverting terminal/$Q_A$ of the D flip-flop $DFF_A$ of the quaternary counter circuit 14A, and the inverting terminal/$Q_B$ of the D flip-flop $DFF_B$ of the quaternary counter circuit 14A are connected to the input terminal of the AND circuit $AND_4$.

The non-inverting terminal Q of the D flip-flop $DFF_3$ in the third stage of the pattern signal output circuit 10, the inverting terminal/$Q_A$ of the D flip-flop $DFF_A$ of the quaternary counter circuit 14A, and the non-inverting terminal $Q_B$ of the D flip-flop $DFF_B$ of the quaternary counter circuit 14A are connected to the input terminal of the AND circuit $AND_5$.

The non-inverting terminal Q of the fifth stage D flip-flop $DFF_5$ of the pattern signal output circuit 10, the non-inverting terminal $Q_A$ of the D flip-flop $DFF_A$ of the quaternary counter circuit 14A, and the inverting terminal/$Q_B$ of the D flip-flop $DFF_B$ of the quaternary counter circuit 14A are connected to the input terminal of the AND circuit $AND_6$.

The non-inverting terminal Q of the final stage D flip-flop $DFF_7$ of the pattern signal output circuit 10, the non-inverting terminal $Q_A$ of the D flip-flop $DFF_A$ of the quaternary counter circuit 14A, and the non-inverting terminal $Q_B$ of the D flip-flop $DFF_B$ of the quaternary counter circuit 14A are connected to the input terminal of the AND circuit $AND_7$.

The output terminals of the AND circuits $AND_4$ to $AND_7$ are connected to the inverting input terminal of the OR circuit OR.

According to the pseudo random signal generation circuit 41 of the second exemplary embodiment, signals output from the non-inverting terminals Q of the respective D flip-flops $DFF_1$ to $DFF_7$ of the pattern signal output circuit 10, are input to the respective input terminals of the AND circuits $AND_1$, $AND_2$ of the bit pattern length count circuit 12. A high level signal is output from the respective output terminals of the AND circuits $AND_1$, $AND_2$ when high level signals are output from all of the non-inverting terminals Q of the D flip-flops $DFF_1$ to $DFF_7$. Accordingly, a high level signal is output from the AND circuit $AND_3$.

A pattern signal having a repeated pattern length of $2^7-1$ bits is output from the non-inverting terminal Q of the D flip-flop $DFF_7$. However, during repeated output of this pattern signal, a high level signal is output from all of the non-inverting terminals Q of the D flip-flops $DFF_1$ to $DFF_7$, every $2^7-1$ bits. Consequently, every time $2^7-1$ bits worth of the signal, corresponding to the pattern length of the pattern signal, is output from the non-inverting terminal Q of the D flip-flop $DFF_7$, a signal expressing the pattern length rises to high level, and is output from the AND circuit $AND_3$ of the bit pattern length count circuit 12.

The signal expressing the pattern length output from the AND circuit $AND_3$ of the bit pattern length count circuit 12 is input to the clock terminal CLK of the D flip-flop $DFF_A$ of the quaternary counter circuit 14A. Consequently, every time the signal expressing the bit pattern length output from the bit pattern length count circuit 12 rises to high level, four types of combination signal, combinations of high level and low level shown in Table 2, are each repeatedly output from the non-inverting terminal $Q_A$, inverting terminal/$Q_A$, non-inverting terminal $Q_B$, and inverting terminal/$Q_B$ of the quaternary counter circuit 14A, respectively. Note that in Table 2 high level is denoted by 1, and low level is denoted by 0.

TABLE 2

| | | | | |
|---|---|---|---|---|
| $Q_A$ | 1 | 0 | 1 | 0 |
| $/Q_A$ | 0 | 1 | 0 | 1 |
| $Q_B$ | 1 | 1 | 0 | 0 |
| $/Q_B$ | 0 | 0 | 1 | 1 |

Every time a high level signal is output from all of the non-inverting terminals of the D flip-flops $DFF_1$ to $DFF_7$, the signal expressing the bit pattern length output from the bit pattern length count circuit 12 rises to high level. Consequently, the non-inverting terminal $Q_A$ and the non-inverting terminal $Q_B$ of the quaternary counter circuit 14A become high level, the inverting terminal/$Q_A$ and the inverting terminal/$Q_B$ of the quaternary counter circuit 14A become low level, and the two high level signals here are input to the AND circuit $AND_7$ as the selection signal. The signal from the non-inverting terminal Q of the D flip-flop $DFF_7$ is also input to the AND circuit $AND_7$. Consequently, every time the selection signal is high level, the signal output from the non-inverting terminal Q of the D flip-flop $DFF_7$ is output as a pseudo random signal through the AND circuit $AND_7$ and the OR circuit OR. The pseudo random signal output from the non-inverting terminal Q of the D flip-flop $DFF_7$ is continuously output until the next rise in the signal expressing the bit pattern length, namely until 127 bits worth has been output.

Similarly, when high level signals (selection signals) are being output from the non-inverting terminal $Q_A$ and the inverting terminal/$Q_B$ of the quaternary counter circuit 14A, the signal output from the non-inverting terminal Q of the D flip-flop $DFF_5$ is selected. As a result thereof, every time the signal output from the non-inverting terminal Q of the D flip-flop $DFF_5$ is high level, this selected signal is output as the pseudo random signal through the AND circuit $AND_6$ and the OR circuit OR.

When high level signals are being output from the inverting terminal/$Q_A$ and the non-inverting terminal $Q_B$ of the quaternary counter circuit 14A, a high level signal output from the non-inverting terminal Q of the D flip-flop $DFF_3$ is output as the pseudo random signal through the AND circuit $AND_5$ and the OR circuit OR.

When high level signals are being output from the inverting terminal/$Q_A$ and the inverting terminal/$Q_B$ of the quaternary counter circuit 14A, a high level signal output from the non-inverting terminal Q of the D flip-flop $DFF_1$ is output as the pseudo random signal through the AND circuit $AND_4$ and the OR circuit OR.

The pseudo random signals described above are output in sequence from the different taps of the pattern signal output circuit 10, according to the four types of combination signal shown in Table 2, namely according to the respective selection signals. Since these pseudo random signals are output from different respective taps, each pattern is different.

Figure 13:
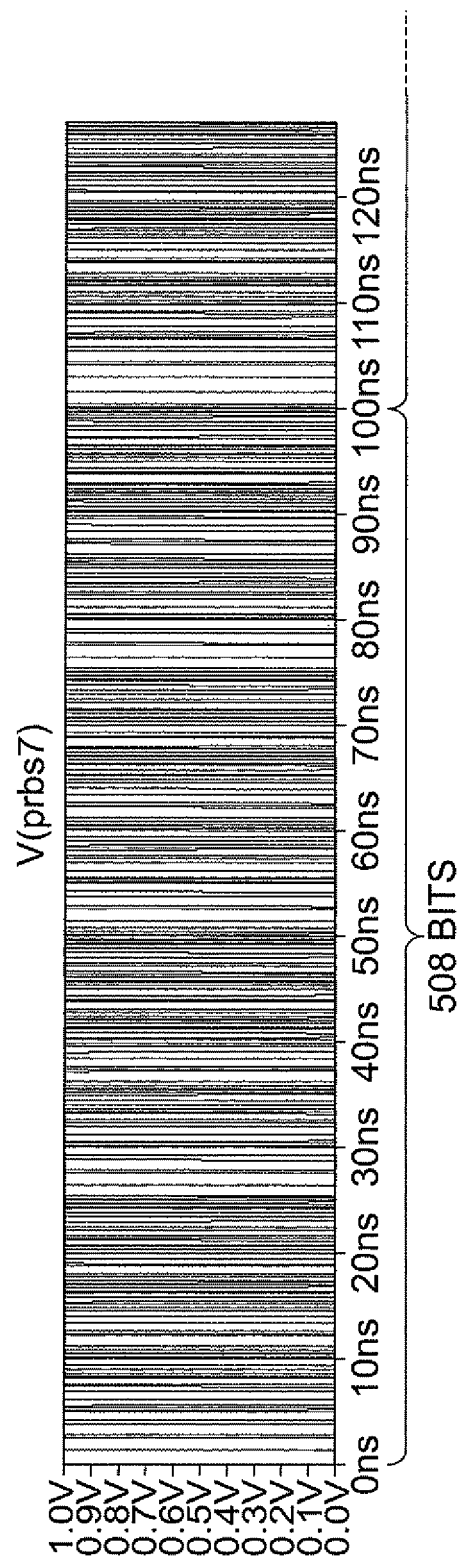
FIG. 13 shows an output waveform of the pseudo random signal generation circuit shown in FIG. 11.

The pseudo random signals of differing pattern are repeatedly output every time selected according to the four types of combination signal. As a result, the bit pattern length of the pseudo random signal in the second exemplary embodiment is, as shown in FIG. 13, 127×4=508 bits, and a pseudo random signal is output in which bit patterns of 508 (($2^N-1$)×M, wherein N=7 and M=4) bits are repeated.

Note that, in the example shown in FIG. 9, the signal output from the non-inverting terminal Q of the D flip-flop $DFF_7$, the signal output from the non-inverting terminal Q of the D flip-flop $DFF_5$, the signal output from the non-inverting terminal Q of the D flip-flop $DFF_3$, and the signal output from the non-inverting terminal Q of the D flip-flop $DFF_1$ are selected in a repeating sequence and output (namely, the selected terminal changes in the sequence: non-inverting terminal Q of the $DFF_7$, non-inverting terminal Q of the $DFF_5$, non-inverting terminal Q of the $DFF_3$, non-inverting terminal Q of the $DFF_1$, non-inverting terminal Q of the $DFF_7$, non-inverting terminal Q of the $DFF_5$, and so on). However, the present invention is not limited thereto, and connections of each of the AND circuit $AND_5$ to $AND_5$ of the tap output shift circuit 16A may be changed, changing the terminal selection sequence.

Figure 10:
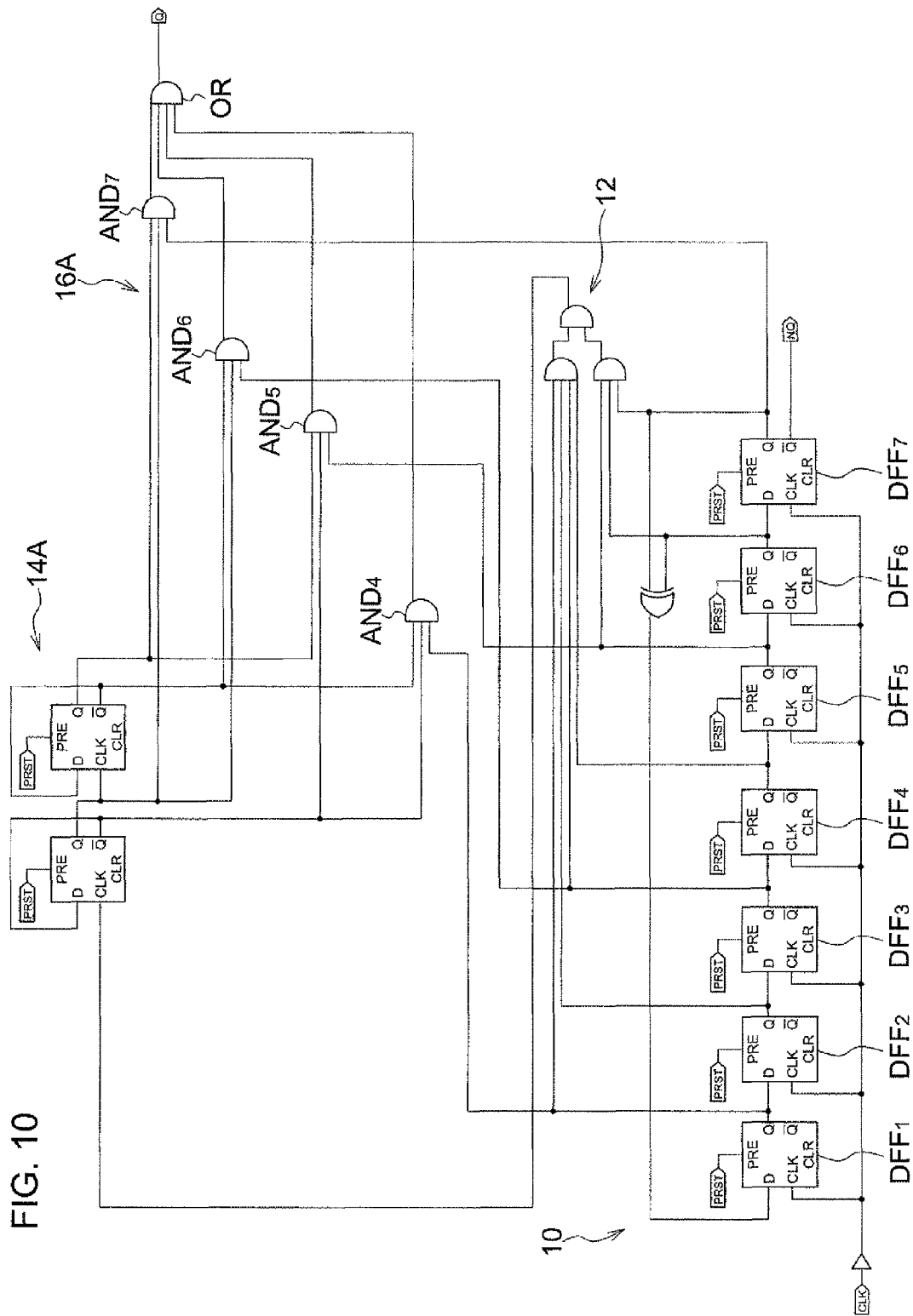
FIG. 10 is a diagram showing an example of a configuration of a pseudo random signal generation circuit with N=7 and M=4.

For example, in the configuration shown in FIG. 9, the non-inverting terminal Q of the third stage D flip-flop $DFF_3$ of the pattern signal output circuit 10 is connected to the input terminal of the AND circuit $AND_5$. The non-inverting terminal Q of the fifth stage D flip-flop $DFF_5$ of the pattern signal output circuit 10 is also connected to the input terminal of the AND circuit $AND_6$. However, as shown in FIG. 10, the non-inverting terminal Q of the fifth stage D flip-flop $DFF_5$ of the pattern signal output circuit 10 may be connected to the input terminal of the AND circuit $AND_5$. The non-inverting terminal Q of the third stage D flip-flop $DFF_3$ of the pattern signal output circuit 10 may also be connected to the input terminal of the AND circuit $AND_6$. By so doing, the selected signal changes in the sequence: the signal output from the non-inverting terminal Q of the D flip-flop $DFF_7$, the signal output from the non-inverting terminal Q of the D flip-flop $DFF_3$, the signal output from the non-inverting terminal Q of the D flip-flop $DFF_5$, signal output from the non-inverting terminal Q of the D flip-flop $DFF_1$, the signal output from the non-inverting terminal Q of the D flip-flop $DFF_7$, the signal output from the non-inverting terminal Q of the D flip-flop $DFF_3$ and so on.

The terminals selected by the selection signal are also not limited to the non-inverting terminal Q of the D flip-flop $DFF_1$, the non-inverting terminal Q of the D flip-flop $DFF_3$, the non-inverting terminal Q of the D flip-flop $DFF_5$, and the non-inverting terminal Q of the D flip-flop $DFF_7$, as described above. In the second exemplary embodiment, since a quaternary counter is employed as the selection signal output circuit, any four different terminal may be selected from the non-inverting terminals Q and the inverting terminals/Q of the respective D flip-flops $DFF_1$ to $DFF_7$ configuring the pattern signal output circuit 10.

Figure 11:
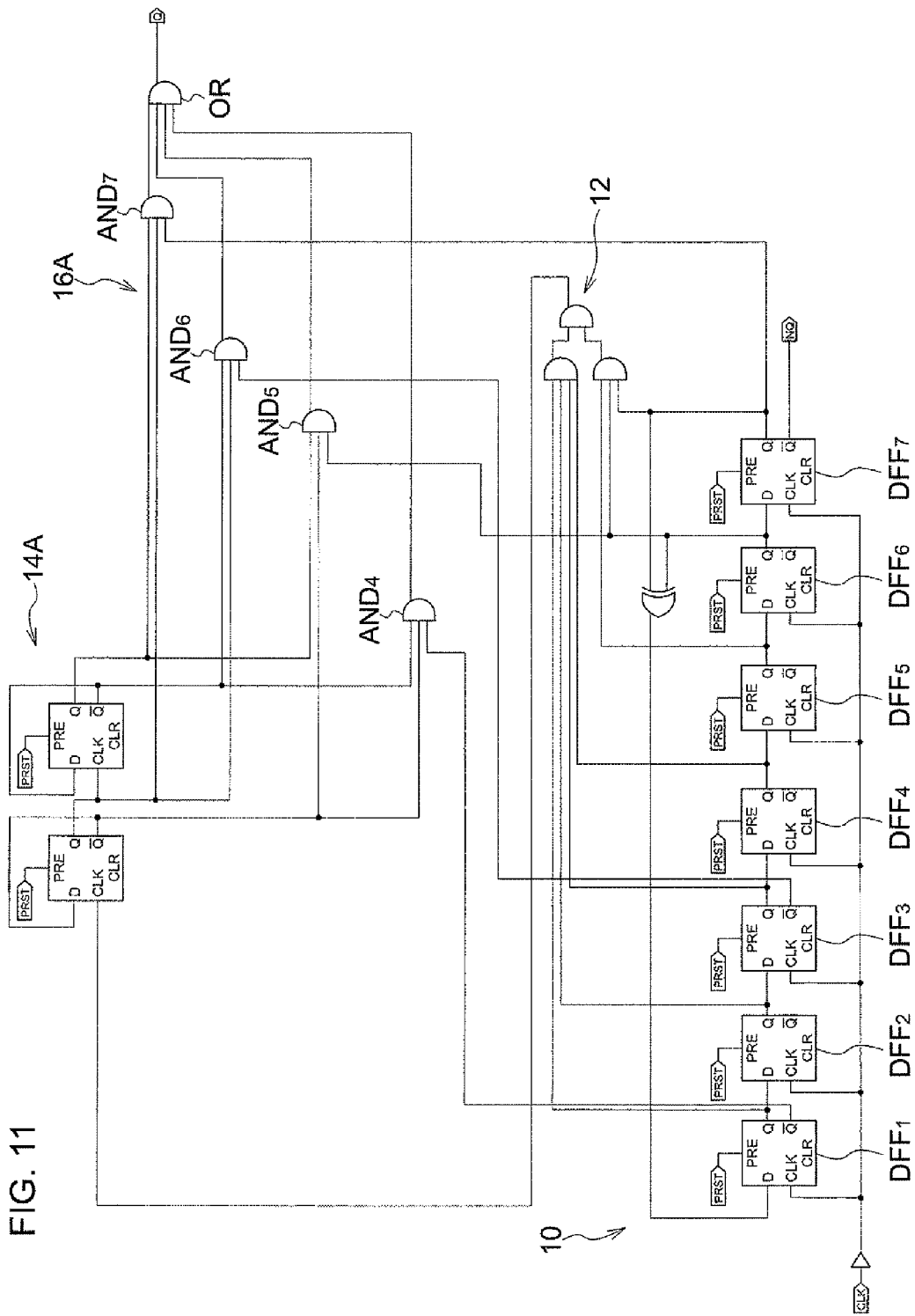
FIG. 11 is a diagram showing an example of a configuration of a pseudo random signal generation circuit with N=7 and M=4.

For example, in the example shown in FIG. 11, the inverting terminal/Q of the first stage D flip-flop $DFF_1$ of the pattern signal output circuit 10, the inverting terminal/$Q_A$ of the D flip-flop $DFF_A$ of the quaternary counter circuit 14A, and the inverting terminal/$Q_B$ of the D flip-flop $DFF_B$ of the quaternary counter circuit 14A, are connected to the input terminal of the AND circuit $AND_4$ of the tap output shift circuit 16A.

The non-inverting terminal Q of the sixth stage D flip-flop $DFF_6$ of the pattern signal output circuit 10, the inverting terminal/$Q_A$ of the D flip-flop $DFF_A$ of the quaternary counter circuit 14A, and the non-inverting terminal $Q_B$ of the D flip-flop $DFF_B$ of the quaternary counter circuit 14A, are connected to the input terminal of the AND circuit $AND_5$.

The inverting terminal/Q of the third stage D flip-flop $DFF_3$ of the pattern signal output circuit 10, the non-inverting terminal $Q_A$ of the D flip-flop $DFF_A$ of the quaternary counter circuit 14A, and the inverting terminal/$Q_B$ of the D flip-flop $DFF_B$ of the quaternary counter circuit 14A, are connected to the input terminal of the AND circuit $AND_6$.

The non-inverting terminal Q of the final stage flip-flop $DFF_7$ of the pattern signal output circuit 10, the non-inverting terminal $Q_A$ of the D flip-flop $DFF_A$ of the quaternary counter circuit 14A, and the non-inverting terminal $Q_B$ of the D flip-flop $DFF_B$ of the quaternary counter circuit 14A are connected to the input terminal of the AND circuit $AND_7$.

According to such a configuration, the signals selected by the selection signal are the signal output from the inverting terminal/Q of the D flip-flop $DFF_1$, the signal output from the inverting terminal/Q of the D flip-flop $DFF_3$, the signal output from the non-inverting terminal Q of the D flip-flop $DFF_6$, and the signal output from the non-inverting terminal Q of the D flip-flop $DFF_7$. Accordingly, sequential selection is made with a selection sequence of: the signal output from the non-inverting terminal Q of the D flip-flop $DFF_7$, the signal output from the inverting terminal/Q of the D flip-flop $DFF_3$, the signal output from the non-inverting terminal Q of the D flip-flop $DFF_6$, signal output from the inverting terminal/Q of the D flip-flop $DFF_1$, the signal output from the non-inverting terminal Q of the D flip-flop $DFF_7$, the signal output from the inverting terminal/Q of the D flip-flop $DFF_3$, and so on.

Third Exemplary Embodiment

Explanation in the first exemplary embodiment is of a case configured with the pseudo random signal generation circuit 41 employing a binary counter as the selection signal output circuit. However, the present invention is not limited thereto and, for example, configuration may be made with a pseudo random signal generation circuit 41 employing a quinary counter. Furthermore, in the first and second exemplary embodiments explanation is of cases of N=7, with a pseudo random signal generation circuit for generating a pseudo random signal simulating 7 bit random data. However, the present invention is not limited thereto, and, for example, configuration may be made with a pseudo random signal generation circuit for generating a pseudo random signal simulating 9 bit random data.

In the third exemplary embodiment, explanation is of an example with N=9, M=5, with a pseudo random signal generation circuit for generating a pseudo random signal simulating 9 bit random data. Since overall configuration is similar to that of the first exemplary embodiment explained with reference to FIG. 1 to FIG. 3, further explanation thereof is omitted. In order to discriminate from the examples given in the first and the second exemplary embodiment, B is appended as a suffix to each of the configuration element numbers of the pseudo random signal generation circuit 41.

Figure 12:
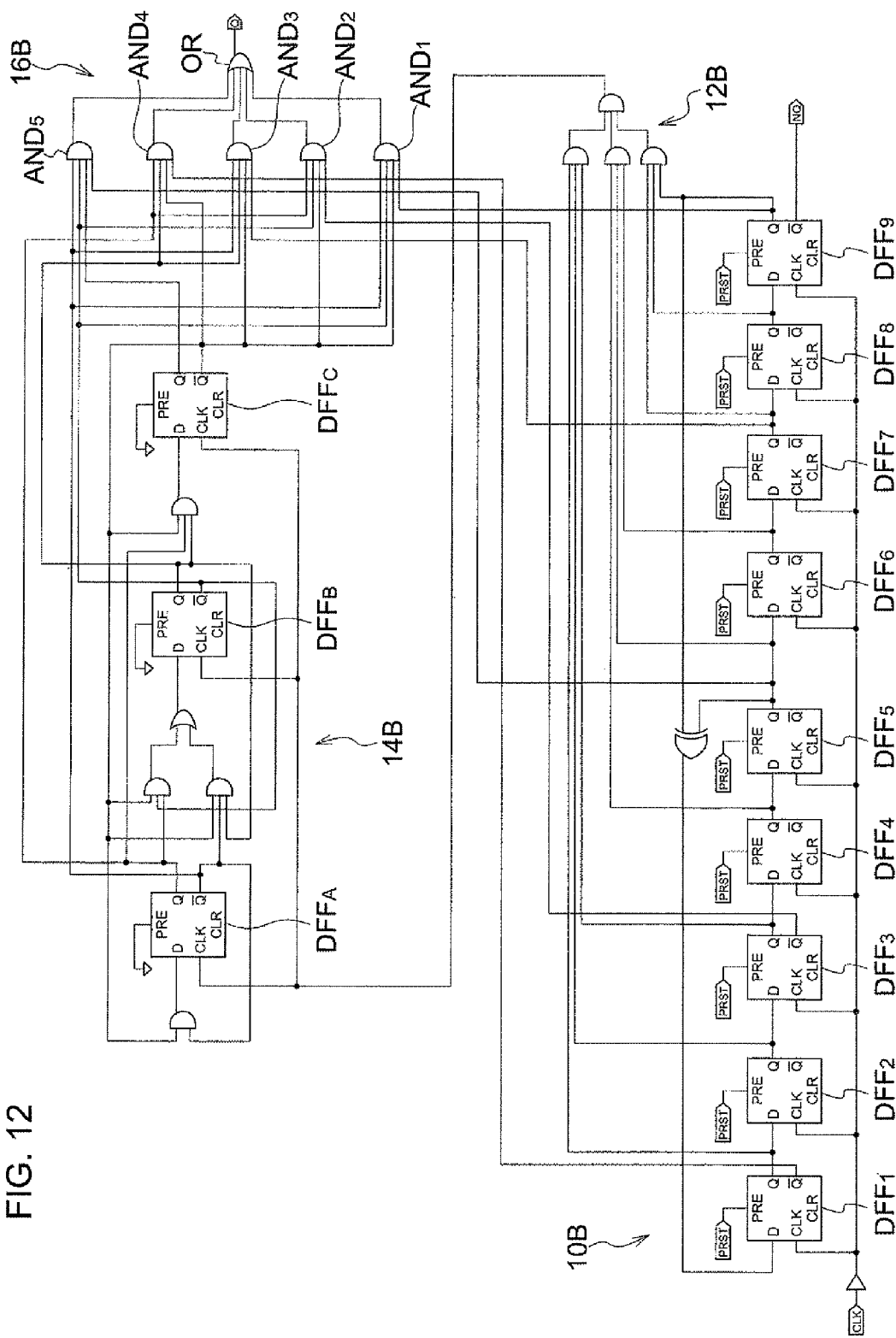
FIG. 12 is a diagram showing an example of a configuration of a pseudo random signal generation circuit with N=9 and M=5.

As shown in FIG. 12, in the third exemplary embodiment, a pattern signal output circuit 10B is provided for outputting from the final stage a pattern signal, in which bit patterns of $2^9-1$ (=511) bits are repeated. A bit pattern length count circuit 12B, equipped with four AND circuits, is connected to the pattern signal output circuit 10B. The output terminal of the bit pattern length count circuit 12B is connected to the input terminals of a quinary counter circuit 14B, serving as a selection signal output circuit, equipped with 5 output terminals. Each of the output terminals of the quinary counter circuit 14B is connected to a tap output shift circuit 16B for switching over the tap for outputting a pseudo random signal and outputting the pseudo random signal.

The pattern signal output circuit 10B is equipped with 9 stages of D flip-flops $DFF_1$ to $DFF_9$. The non-inverting terminal Q of the pervious adjacent stage D flip-flop $DFF_K$ (K=1 to 8) in the D flip-flops $DFF_1$ to $DFF_9$, is connected to the input terminal D of the following adjacent stage D flip-flop $DFF_{K+1}$.

The non-inverting terminal Q of the final stage D flip-flop $DFF_9$ and the non-inverting terminal Q of the D flip-flop $DFF_5$ of four stages previous to the final stage, are connected to the input terminal D of the first stage D flip-flop $DFF_1$ through an exclusive-OR circuit EXOR. A clock signal generator (not shown in the figures) is connected to the clock terminals CLK of each of the respective D flip-flops $DFF_1$ to $DFF_9$, such that a clock signal is input thereto.

A pattern signal, in which bit pattern of $2^9-1$ (=511) bits are repeated, is output from the non-inverting terminal Q of the final stage D flip-flop $DFF_9$ of the pattern signal output circuit 10B.

The respective non-inverting terminals Q of the D flip-flops $DFF_1$ to $DFF_9$ in the respective stages of the pattern signal output circuit 10B are connected to the input terminals of 3 AND circuits out of 4 AND circuits in the bit pattern length count circuit 12B. Furthermore, each of the output terminals of these 3 AND circuits is connected to the input terminal of the remaining AND circuit. A signal expressing the bit pattern length, rising every time high level signals are output from all of the non-inverting terminals Q of the D flip-flops $DFF_1$ to $DFF_9$, is output from this remaining AND circuit.

Three D flip-flops $DFF_A$, $DDF_B$ and $DFF_1$ are provided in the quinary counter circuit 14B, and are connected as illustrated in FIG. 12, via the four AND circuits and a single OR circuit OR.

The signal expressing the pattern length output from the bit pattern length count circuit 12B is input to the clock terminal CLK of the D flip-flop $DFF_A$ of the quinary counter circuit 14B. Every time the signal expressing the bit pattern length output from the bit pattern length count circuit 12B rises to high level, combination signals of five types, combinations of high level and low level shown in Table 3, are repeatedly output from the non-inverting terminal $Q_A$, inverting terminal/$Q_A$, the non-inverting terminal $Q_B$, the inverting terminal/$Q_B$, the non-inverting terminal $Q_C$, and the inverting terminal/$Q_C$ of the quinary counter circuit 14B. Note that in Table 3, 1 denotes high level and 0 denotes low level.

TABLE 3

| $Q_A$ | 0 | 1 | 0 | 1 | 0 |
| /$Q_A$ | 1 | 0 | 1 | 0 | 1 |
| $Q_B$ | 0 | 0 | 1 | 1 | 0 |
| /$Q_B$ | 1 | 1 | 0 | 0 | 1 |
| $Q_C$ | 0 | 0 | 0 | 0 | 1 |
| /$Q_C$ | 1 | 1 | 1 | 1 | 0 |

5 AND circuits $AND_1$ to $AND_5$ and an OR circuit OR are provided in the tap output shift circuit 16B.

The non-inverting terminal Q of the final stage D flip-flop $DFF_9$ of the pattern signal output circuit 10B, the inverting terminal/$Q_A$ of the D flip-flop $DFF_A$ of the quinary counter circuit 14B, the inverting terminal/$Q_B$ of the D flip-flop $DDF_B$ of the quinary counter circuit 14B, and the inverting terminal/$Q_C$ of the D flip-flop $DFF_C$ of the quinary counter circuit 14B, are connected to the input terminal of the AND circuit $AND_1$.

The inverting terminal/Q of the third stage D flip-flop $DFF_3$ of the pattern signal output circuit 10B, the non-inverting terminal $Q_A$ of the D flip-flop $DFF_A$ of the quinary counter circuit 14B, the inverting terminal/$Q_B$ of the D flip-flop $DDF_B$ of the quinary counter circuit 14B, and the inverting terminal/$Q_C$ of the D flip-flop $DFF_C$, are connected to the input terminal of the AND circuit $AND_2$.

The non-inverting terminal Q of the seventh stage D flip-flop $DFF_7$ of the pattern signal output circuit 10B, the inverting terminal/$Q_A$ of the D flip-flop $DFF_A$ of the quinary counter circuit 14B, the non-inverting terminal $Q_B$ of the D flip-flop $DDF_B$ of the quinary counter circuit 14B, and the inverting terminal/$Q_C$ of the D flip-flop $DFF_C$ of the quinary counter circuit 14B, are connected to the input terminal of the AND circuit $AND_3$.

The inverting terminal/Q of the first stage D flip-flop $DFF_1$ of the pattern signal output circuit 10B, the non-inverting terminal $Q_A$ of the D flip-flop $DFF_A$ of the quinary counter circuit 14B, the non-inverting terminal $Q_B$ of the D flip-flop $DDF_B$ of the quinary counter circuit 14B, and the inverting terminal/$Q_C$ of the D flip-flop $DFF_C$, are connected to the input terminal of the AND circuit $AND_4$.

The non-inverting terminal Q of the fifth stage D flip-flop $DFF_5$ of the pattern signal output circuit 10B, the inverting terminal/$Q_A$ of the D flip-flop $DFF_A$ of the quinary counter circuit 14B, the inverting terminal/$Q_B$ of the D flip-flop $DDF_B$ of the quinary counter circuit 14B, and the non-inverting terminal $Q_C$ of the D flip-flop $DFF_C$ of the quinary counter circuit 14B, are connected to the input terminal of the AND circuit $AND_5$.

The output terminals of the AND circuits $AND_1$ to $AND_5$ are connected to the inverting input terminal of the OR circuit OR.

According to the pseudo random signal generation circuit 41 of the third exemplary embodiment, a pattern signal having a $2^9-1$ pattern length is repeatedly output from the non-inverting terminal Q of the D flip-flop $DFF_9$. However, as this pattern signal is being repeatedly output, high level signals are output from all of the non-inverting terminals Q of the D flip-flops $DFF_1$ to $DFF_9$ every $2^9-1$ bits. Accordingly, every time $2^9-1$ bits worth of signal, corresponding to the pattern length of the pattern signal, is output from the non-inverting terminal Q of the D flip-flop $DFF_9$, a signal expressing the pattern length, rising to high level, is output from the bit pattern length count circuit 12B.

The signal expressing the pattern length output from the bit pattern length count circuit 12B is input to the clock terminal CLK of the D flip-flop $DFF_A$ of the quinary counter circuit 14B. Accordingly, every time the signal expressing the bit pattern length output from the bit pattern length count circuit 12B rises to high level, as stated above, the 5 types of combination signal are repeatedly output from the quinary counter circuit 14B.

Every time high level signals are output from all of the non-inverting terminals Q of the D flip-flops $DFF_1$ to $DFF_9$, the signal expressing the bit pattern length output from the bit pattern length count circuit 12B rises to high level. Consequently, the inverting terminal/$Q_A$, the inverting terminal/$Q_B$, the inverting terminal/$Q_C$ of the quinary counter circuit 14B are high level, and the non-inverting terminal $Q_A$, the non-inverting terminal $Q_B$ and the non-inverting terminal $Q_C$ are low level. As a result, the 3 high level signals thereof are input to AND circuit $AND_1$ as the selection signal. The signal output from the non-inverting terminal Q of the D flip-flop $DFF_9$ is input to the AND circuit $AND_1$. Consequently, every time these selection signals are high level, the signal output from the non-inverting terminal Q of the D flip-flop $DFF_9$ is output as a pseudo random signal through the AND circuit $AND_1$ and the OR circuit OR. The pseudo random signal output from the non-inverting terminal Q of the D flip-flop $DFF_9$ is continuously output until the next rise in the signal expressing the bit pattern length, namely until 511 bits worth has been output.

Similarly, when a high level signal (selection signal) is output from the non-inverting terminal $Q_A$, the inverting terminal/$Q_B$ and the inverting terminal/$Q_C$ of the quinary counter circuit 14B, the signal output from the inverting terminal/Q of the D flip-flop $DFF_3$ is selected. Next, every time the signal output from the inverting terminal/Q of the D flip-flop $DFF_3$ is high level, this selected signal is output as the pseudo random signal through the AND circuit $AND_2$ and the OR circuit OR.

When a high level signal (selection signal) is output from the inverting terminal/$Q_A$, the non-inverting terminal $Q_B$ and the inverting terminal/$Q_C$ of the quinary counter circuit 14B, the signal output from the non-inverting terminal Q of the D flip-flop $DFF_7$ is selected. As a result thereof, every time the signal output from the non-inverting terminal Q of the D flip-flop $DFF_7$ is high level, this selected signal is output as the pseudo random signal through the AND circuit $AND_3$ and the OR circuit OR.

Furthermore, when a high level signal (selection signal) is output from the non-inverting terminal $Q_A$, the non-inverting terminal $Q_B$ and the inverting terminal/$Q_C$ of the quinary counter circuit 14B, the signal output from the inverting terminal/Q of the D flip-flop $DFF_1$ is selected. As a result thereof, every time the signal output from the inverting terminal/Q of the D flip-flop $DFF_1$ is high level, this selected signal is output as the pseudo random signal through the AND circuit $AND_4$ and the OR circuit OR.

When a high level signal (selection signal) is output from the inverting terminal/$Q_A$, the inverting terminal/$Q_B$, and the non-inverting terminal $Q_C$ of the quinary counter circuit 14B, the signal output from the non-inverting terminal Q of the D flip-flop $DFF_5$ is selected. As a result thereof, every time the signal output from the non-inverting terminal Q of the D flip-flop $DFF_5$ is high level, this selected signal is output as the pseudo random signal through the AND circuit $AND_5$ and the OR circuit OR.

The above pseudo random pattern signals are output in sequence from the different taps of the pattern signal output circuit 10B according to the 5 types of combination signal shown in Table 3, namely according to the selection signal. Since these pseudo random signals are each output from different taps, they are each of different respective patterns.

The pseudo random signals of different patterns are repeatedly output every time they are selected by the 5 types of combination signal. As a result thereof, a pseudo random signal of the third exemplary embodiment is a pseudo random signal in which a bit pattern is repeated with a bit pattern length of 511×5=2555 (($2^N-1$)×M, wherein N=9, M=5) bits.

Note that the signals selected by the selection signals are not limited to the 5 signals as described above, and nor is the sequence of selection limited to that described above. Namely, in the third exemplary embodiment, since a quinary counter is employed as the selection signal output circuit, signals output from any 5 different terminals, out of the non-inverting terminals Q and inverting terminals/Q of the respective D flip-flops $DFF_1$ to $DFF_9$ configuring the pattern signal output circuit 10B, may be selected. The connections of the AND circuits AND to $AND_5$ of the tap output shift circuit 16B may be changed, changing the selection sequence of the terminals selected.

[Comparison of Output Waveform and FFT]

Figure 14:
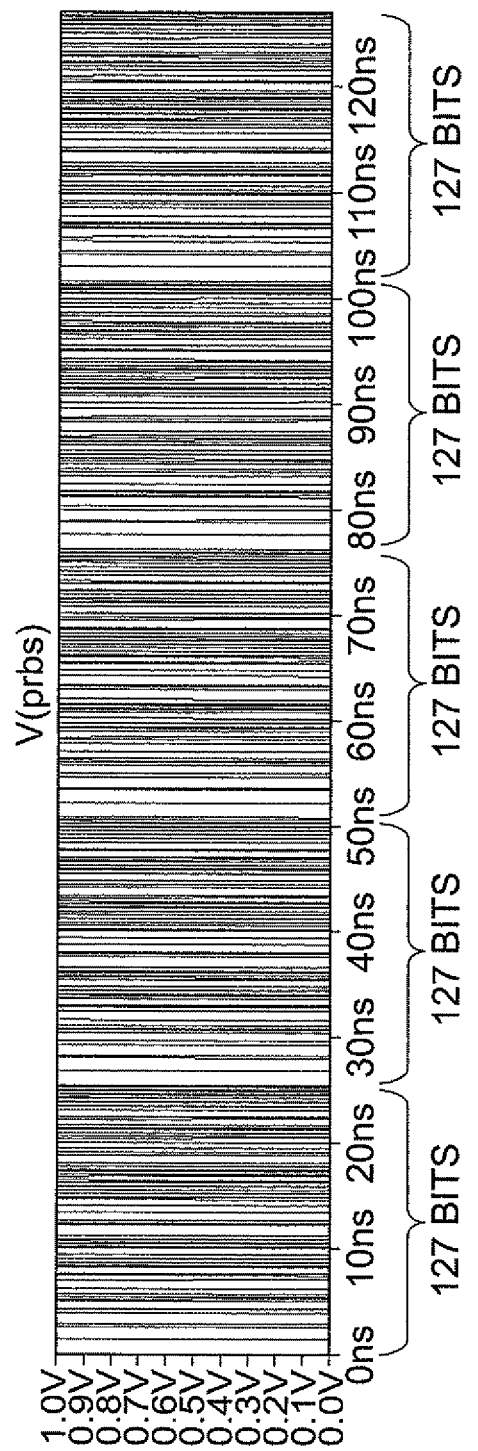
FIG. 14 shows an output waveform of the pattern signal output circuit shown in FIG. 11.

The output waveform of the pseudo random signal generation circuit 41 shown in FIG. 11, explained in the second exemplary embodiment, is shown in FIG. 13. As a Comparative Example, an output waveform of a conventional pseudo random signal generating circuit, corresponding to that of the pattern signal output circuit 10 of FIG. 11, is shown in FIG. 14.

As shown in FIG. 13, since the same 127 bit pattern is repeated from the pattern signal output circuit 10, when the base frequency is 2.5 GHz, radiation noise is generated at frequency 1/63.5 (39.37 MHz). However, when configured as the pseudo random signal generation circuit 41 shown in FIG.

11, the pattern of the pseudo random signal repeats at 127×4=508 bits. Accordingly, generation of high frequency at 39.37 MHz, generated every 25.4 ns, is greatly reduced.

Figure 15:
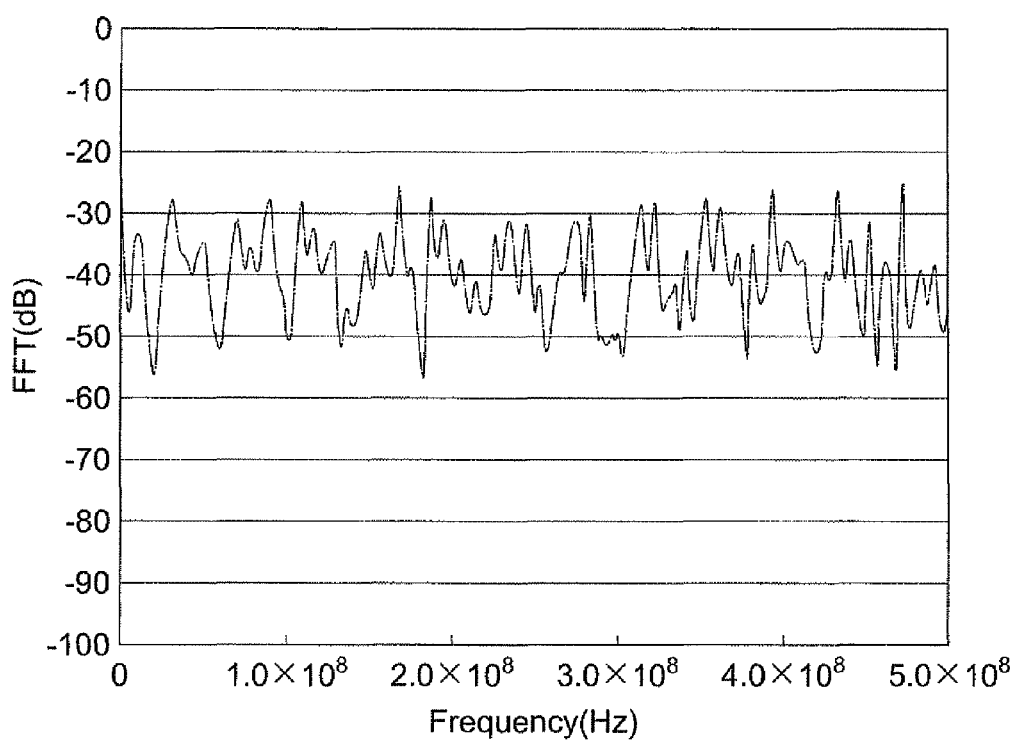
FIG. 15 is a graph showing the output waveform of the pseudo random signal generation circuit shown in FIG. 11, subjected to a fast Fourier transform (FFT)
Figure 16:
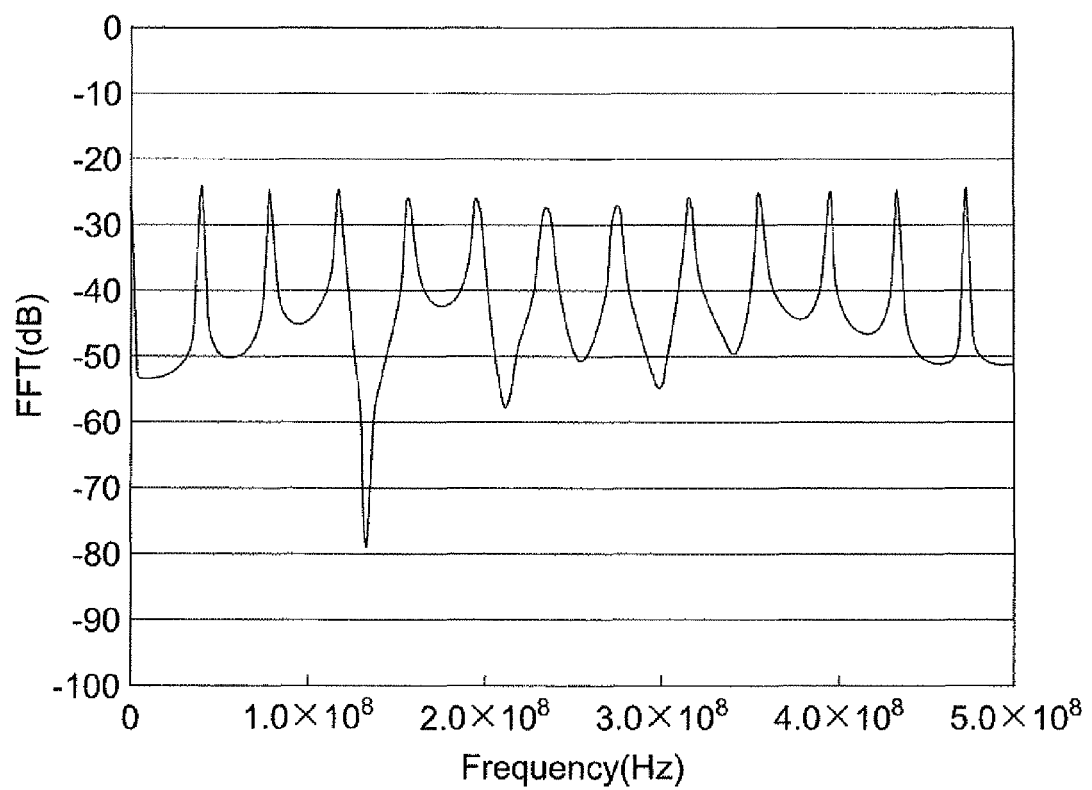
FIG. 16 is a graph showing an FFT of the output waveform of the pattern signal output circuit shown in FIG. 11.
Figure 17:
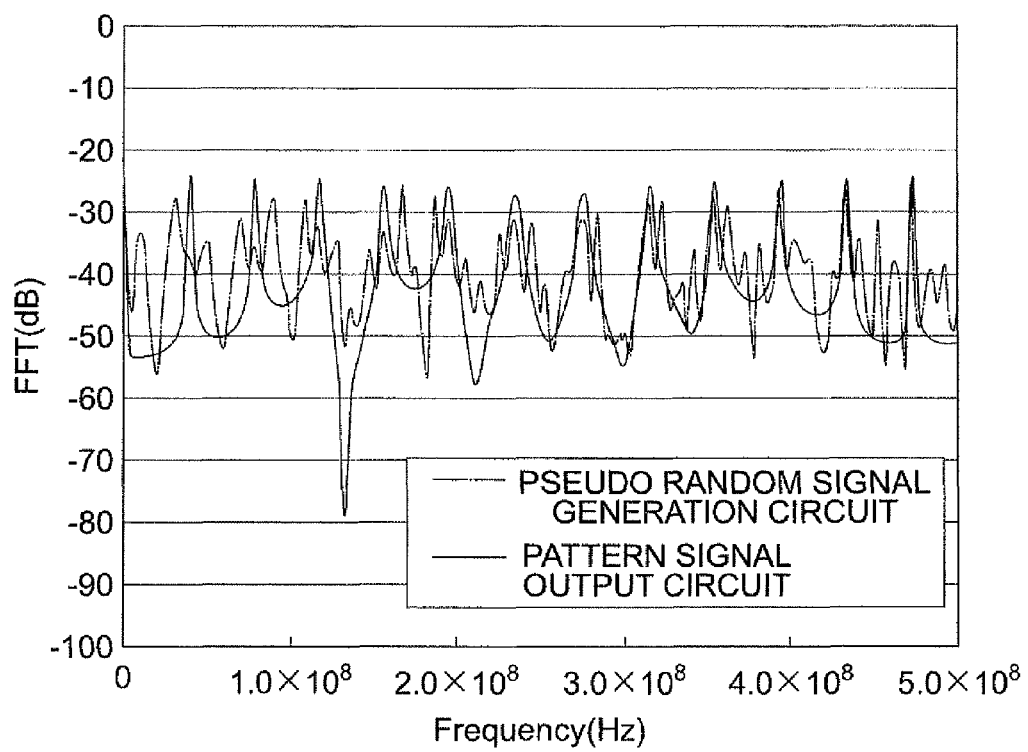
FIG. 17 is a graph showing the waveforms of FIG. 15 and FIG. 16 superimposed on each other.

FIG. 15 shows the output waveform of the pseudo random signal generation circuit 41, explained using FIG. 11, subjected to fast Fourier transform (FFT). As a Comparative Example, a FFT of the output waveform of the pattern signal output circuit 10 corresponding to a conventional pseudo random signal generating circuit is shown in FIG. 16. FIG. 17 is a graph showing the waveforms of FIG. 15 and FIG. 16 superimposed on each other.

As illustrated in the figures, high frequency at 39.37 MHz is reduced in a wide frequency band. As can be seen from the comparison in FIG. 17, the peak values of the FFT spectrum are also greatly lowered. Since FFT is the cause of undesired radiation noise by Electromagnetic Interference (EMI), the level of EMI undesired radiation noise is lowered by lowering the peak values of the FFT spectrum.

Figure 18:
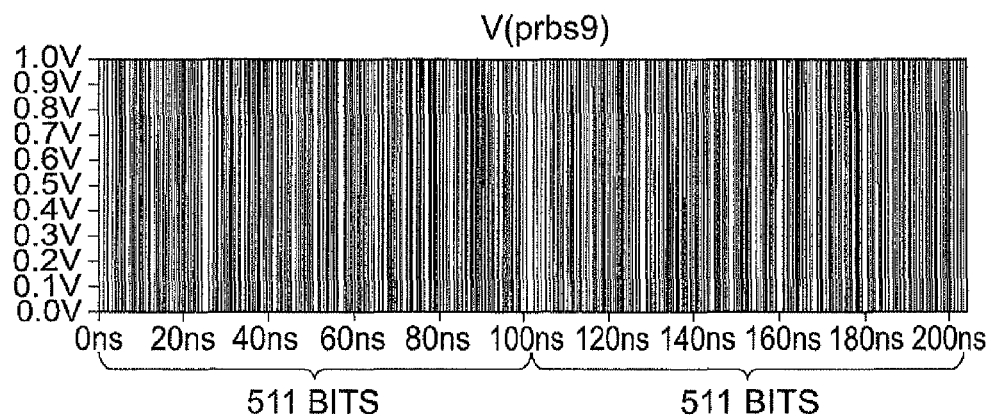
FIG. 18 shows the output waveform of the pseudo random signal generation circuit shown in FIG. 12.
Figure 19:
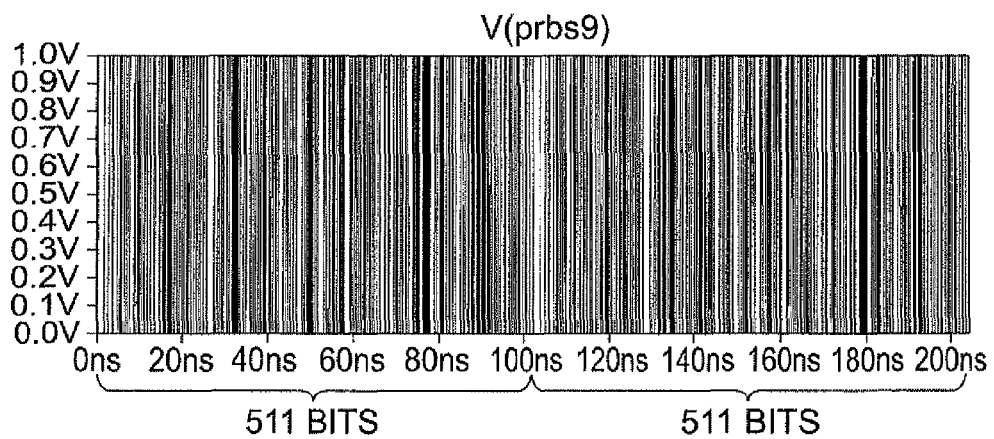
FIG. 19 shows the output waveform of the pattern signal output circuit shown in FIG. 12.

Next, the output waveform of the pseudo random signal generation circuit 41, explained with FIG. 12, in the third exemplary embodiment is shown in FIG. 18. As a Comparative Example, an output waveform of the pattern signal output circuit 10B for a corresponding conventional pseudo random signal generating circuit is shown in FIG. 19.

The output signal of the pattern signal output circuit 10B is a pseudo random signals repeating at $2^9-1=511$ bits. For example, in a 5 Gbps (2.5 GHz) signal, since the duration of each bit is 200 ps, the duration of a 511 bit random signal is 511×200 ps=102.2 ns, and therefore the same pattern is repeated every 102.2 ns. However, as shown in FIG. 12, in the pseudo random signal generation circuit 41, since the number of output taps is 5, and the pattern of the pseudo random signal repeats at 511×5=2555 bits. As can be seen from FIG. 19, the output waveform of the pattern signal output circuit 10B has the same successive 511 bit patterns. However, the output waveform from the pseudo random signal generation circuit shown in FIG. 18 has different successive 511 bit patterns. Consequently, generation of high frequency at 9.784 MHz, corresponding to the inverse of 102.2 ns, due to repetition of the same pattern every 102.2 ns, is suppressed.

Figure 20:
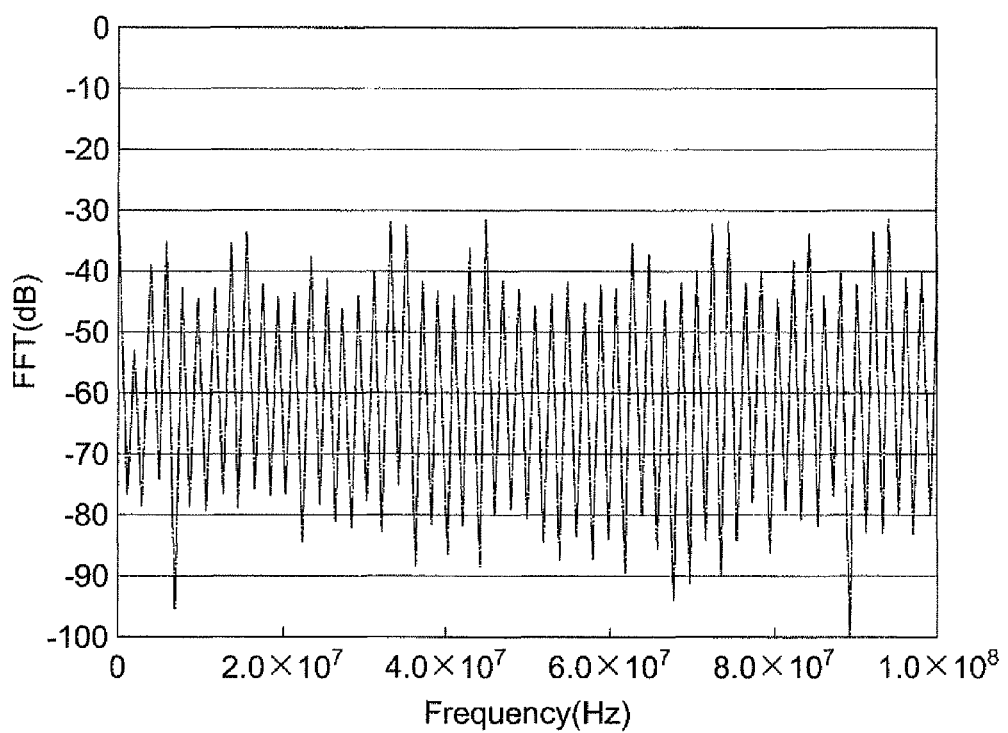
FIG. 20 is a graph showing an FFT of the output waveform of the pseudo random signal generation circuit shown in FIG. 12.
Figure 21:
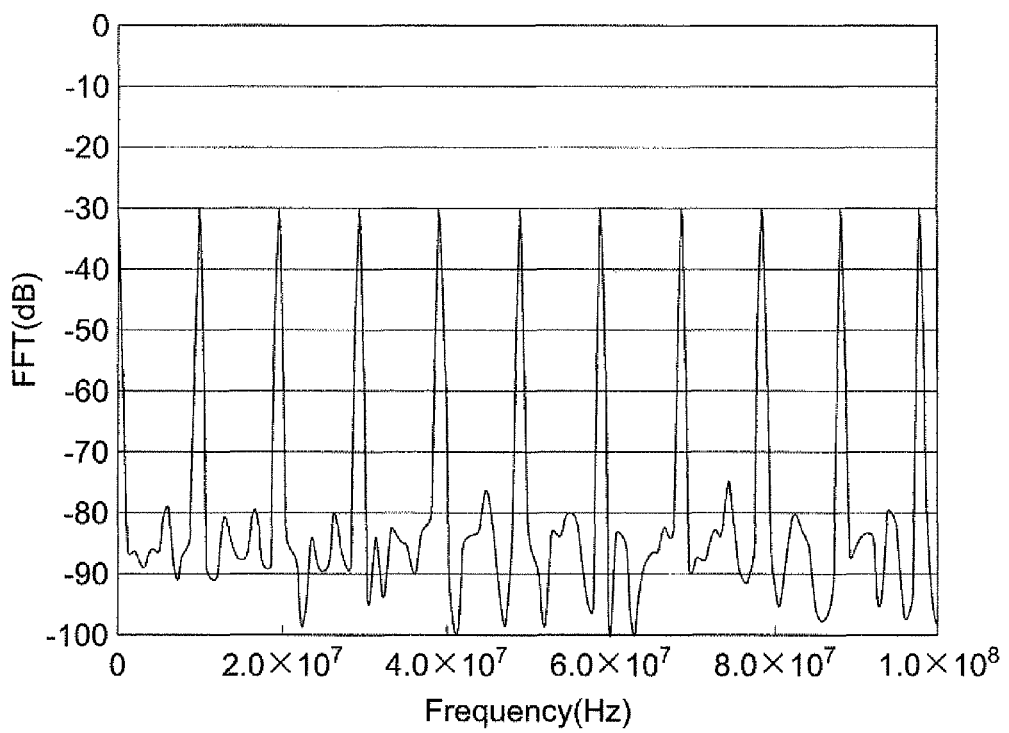
FIG. 21 is a graph showing an FFT of the output waveform of the pattern signal output circuit shown in FIG. 12.
Figure 22:
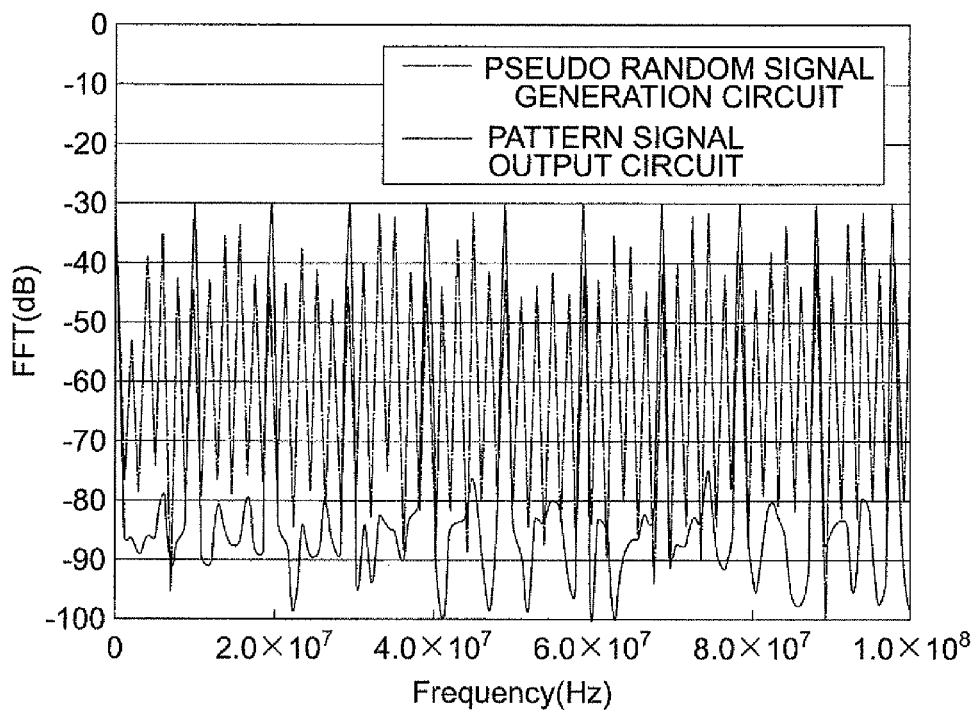
FIG. 22 is a graph showing the waveforms of FIG. 20 and FIG. 21 superimposed on each other.

Next, a FFT of the output waveform of the pseudo random signal generation circuit 41, explained using FIG. 12, is shown in FIG. 20. As a Comparative Example, a FFT of an output waveform of the pattern signal output circuit 10 corresponding to a conventional pseudo random signal generation circuit is shown in FIG. 21. FIG. 22 is a graph showing the waveforms of FIG. 20 and FIG. 21 superimposed on each other.

As seen from the result of FFT in FIG. 20, high frequency at 9.784 MHz, corresponding to the inverse of 102.2 ns, is reduced. Furthermore, it is clear from FIG. 22, that the peak values of the FFT spectrum are lowered. Since FFT is the cause of undesired radiation noise in Electromagnetic Interference (EMI), the level of EMI undesired radiation noise is lowered by lowering the peak values of the FFT spectrum.

While explanation is given here of examples of the output waveforms and FFTs for the pseudo random signal generation circuits 41 shown in FIG. 11 and FIG. 12, the level of EMI undesired radiation noise is also reduced similarly in other configurations.

[Tap Selection]

As explained above, each of the exemplary embodiments employs a base-M counter circuit 14 as a selection signal output circuit, and select signals are output from M different individual terminals, out of the non-inverting terminals Q and the inverting terminals/Q of the respective D flip-flops configuring the pattern signal output circuit 10. Accordingly, reductions in the EMI undesired radiation noise in each of the exemplary embodiments are explained. However, the reduction effect on radiation noise is further enhanced by setting the tap positions as below.

Explanation follows of an example with N=7, M=4, a pseudo random signal generation circuit 41 generating a pseudo random signal simulating 7 bit random data.

Figure 23:
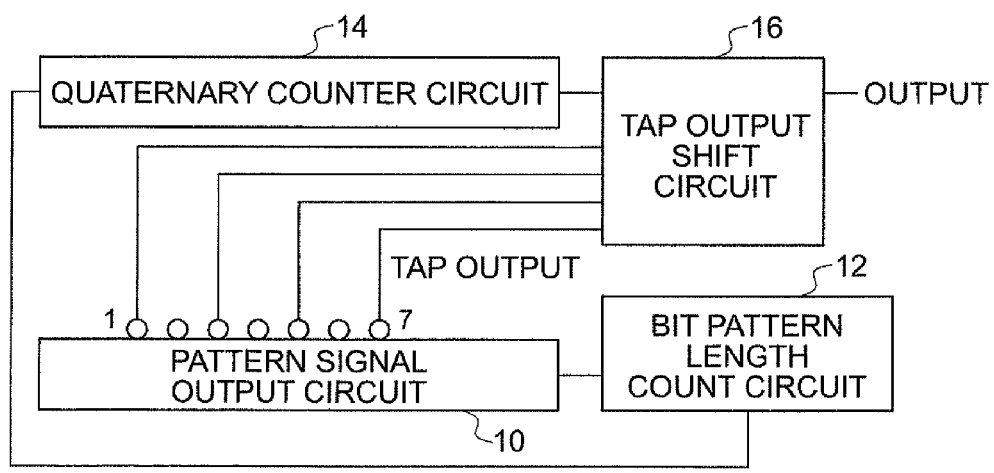
FIG. 23 is a schematic diagram showing an example of a configuration of a pseudo random signal generation circuit with N=7 and M=4.

FIG. 23 is a diagram schematically showing a pseudo random signal generation circuit 41 in a case configured such that terminals of adjacent D flip-flops are not selected in succession. In FIG. 23, for example, the pseudo random signal generation circuit 41 is schematically shown for a case configured such that connections are (such that selection is made of terminals) at tap positions of 4 non-inverting terminals Q (or inverting terminals/Q) of flip-flops at every other one stage from the first stage, these being D flip-flop $DFF_1$, D flip-flop $DFF_3$, D flip-flop $DFF_5$, and D flip-flop $DFF_7$. The pseudo random signal generation circuit 41 of the configuration of FIG. 23 is referred so as pseudo random signal generation circuit (tap1357).

Figure 24:
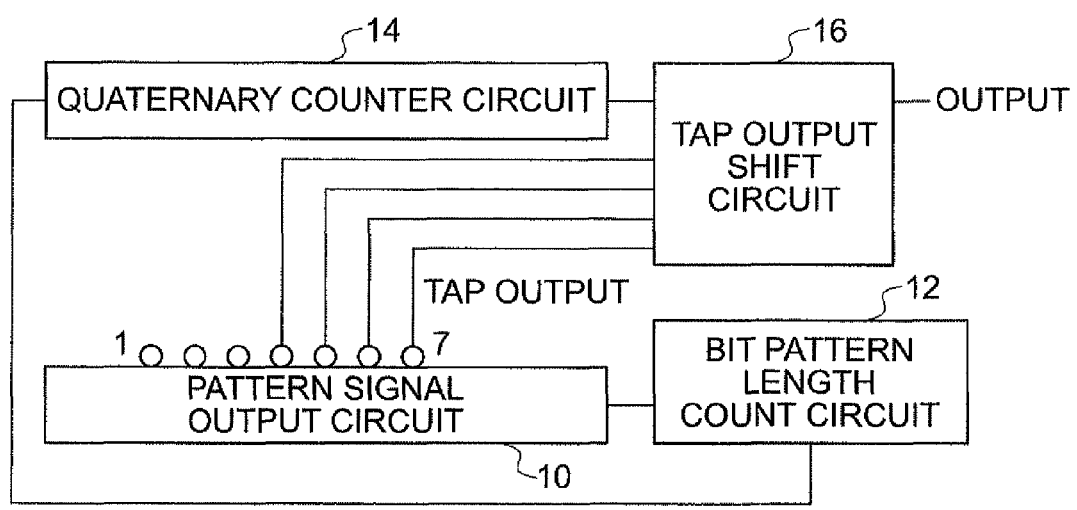
FIG. 24 is a schematic diagram showing another example of a configuration of a pseudo random signal generation circuit with N=7 and M=4.

FIG. 24 is a diagram schematically showing a pseudo random signal generation circuit 41 in a case where configuration is made such that terminals of adjacent D flip-flops are selected in succession. In FIG. 24, for example, the pseudo random signal generation circuit 41 is schematically shown for a case configured such that connections are to tap positions of 4 non-inverting terminals Q (or the inverting terminals/Q) of D flip-flops in the sequence from D flip-flop $DFF_4$, D flip-flop $DFF_5$, D flip-flop $DFF_6$, and D flip-flop $DFF_7$. The pseudo random signal generation circuit 41 of the configuration of FIG. 24 is referred so as pseudo random signal generation circuit (tap4567).

A pseudo random signal generation circuit 41 in a case utilizing only the output tap of the D flip-flop $DFF_7$ of the final stage (not shown in the figures) is referred to as pseudo random signal generation circuit (tap7).

Figure 25:
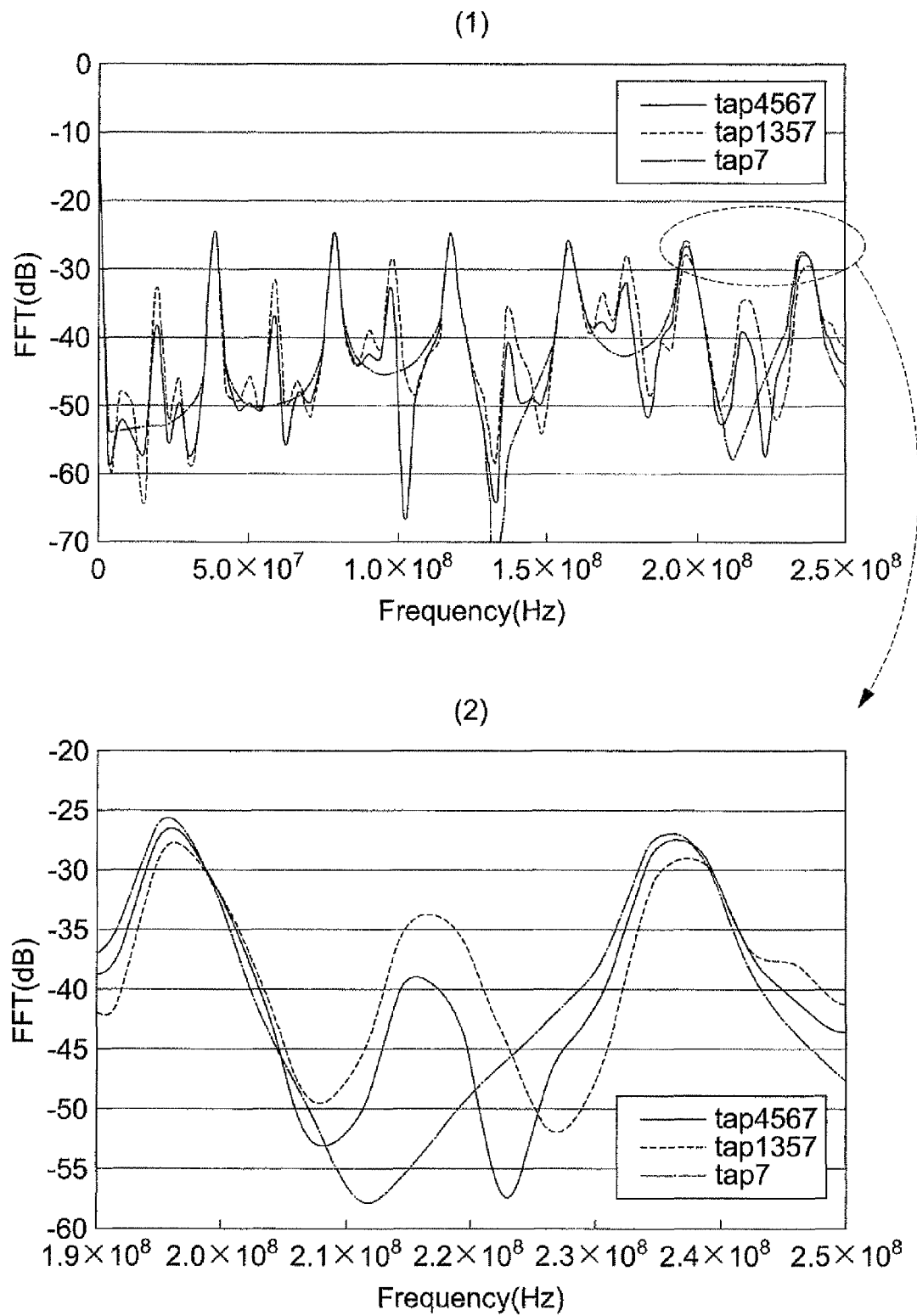
FIG. 25 is a graph showing FFTs of respective output waveforms of pseudo random signal generation circuits for cases employing the output taps of the pseudo random signal generation circuit of FIG. 23, the output taps of pseudo random signal generation circuit of FIG. 24, and only the output tap of the final stage D flip-flop $DFF_7$.

FIG. 25 is a graph showing FFTs performed on each of the output waveforms from the pseudo random signal generation circuit (tap 1357), the pseudo random signal generation circuit (tap4567), and the pseudo random signal generation circuit (tap7).

It is clear from FIG. 25, by looking in the vicinity of 195 MHz and 235 MHz, that pseudo random signal generation circuit (tap1357) has a greater reduction effect on the radiation noise than that of the pseudo random signal generation circuit (tap4567).

Explanation follows of an example, in which N=9 and M=5, a pseudo random signal generation circuit 41 that generates a pseudo random signal simulating 9 bit random data.

Figure 26:
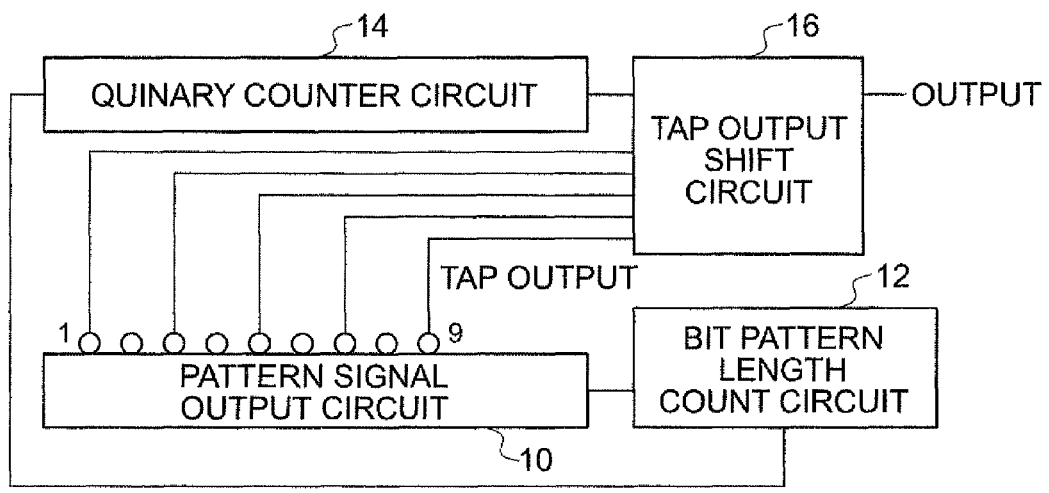
FIG. 26 is a schematic diagram showing an example of a configuration of a pseudo random signal generation circuit with N=9 and M=5.

FIG. 26 is a diagram schematically showing a pseudo random signal generation circuit 41 in a case where configuration is made such that terminals of adjacent D flip-flops are not selected in succession. In FIG. 26, for example, the pseudo random signal generation circuit 41 is schematically shown for a case configured such that connections are to tap positions of 5 non-inverting terminals Q (or the inverting terminals/Q) of flip-flops at every other stage from the first stage, these being D flip-flop $DFF_1$, D flip-flop $DFF_3$, D flip-flop $DFF_5$, D flip-flop $DFF_7$ and D flip-flop $DFF_9$. The pseudo random signal generation circuit 41 of the configuration of FIG. 26 is referred so as pseudo random signal generation circuit (tap13579).

Figure 27:
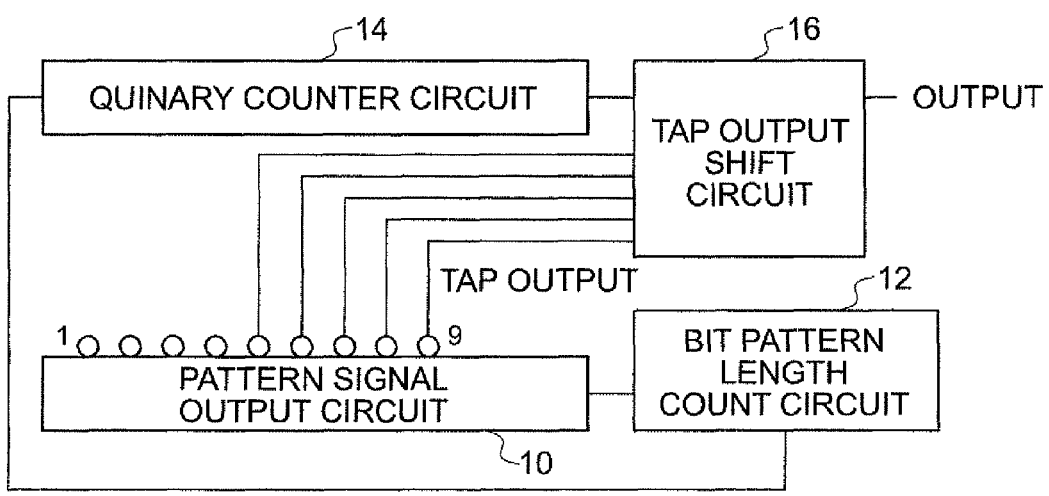
FIG. 27 is a schematic diagram showing an example of a configuration of a pseudo random signal generation circuit with N=9 and M=5.

FIG. 27 is a diagram schematically showing a pseudo random signal generation circuit 41 in a case where configuration is made such that terminals of adjacent D flip-flops are selected in succession. In FIG. 27, for example, the pseudo random signal generation circuit 41 is schematically shown for a case configured such that connection is to tap positions of the non-inverting terminals Q (or the inverting terminals/Q) of 5 D flip-flops in the sequence from D flip-flop DFF$_5$, D flip-flop DFF$_6$, and D flip-flop DFF$_7$, D flip-flop DFF$_8$, D flip-flop DFF$_9$. The pseudo random signal generation circuit 41 of the configuration of FIG. 27 is referred so as pseudo random signal generation circuit (tap56789).

Figure 28:
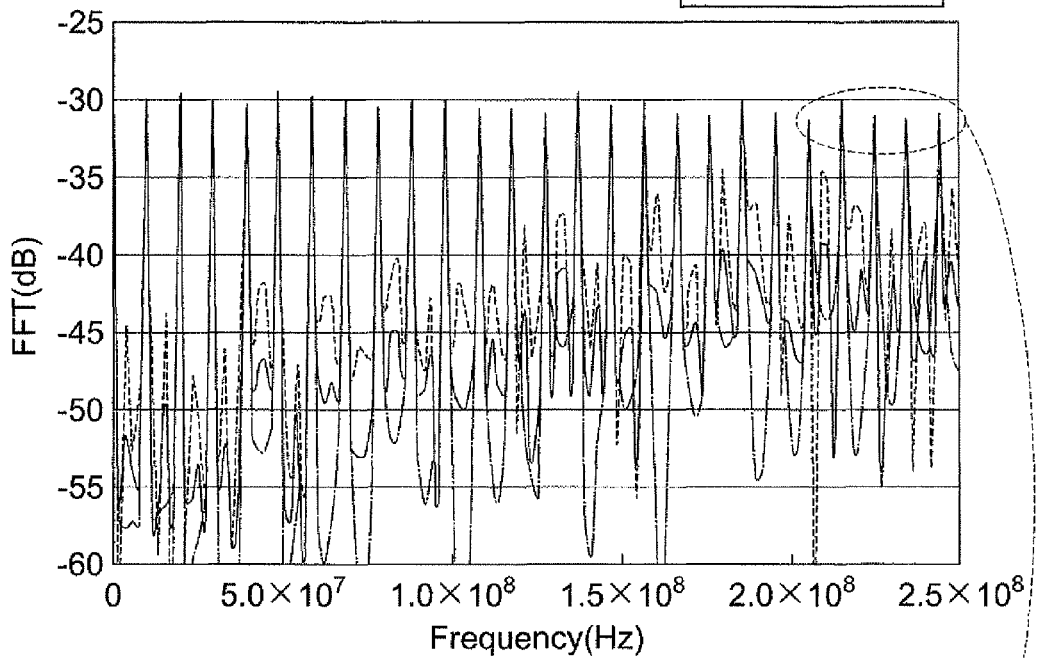
FIG. 28 is a graph showing FFTs of respective output waveforms of pseudo random signal generation circuits for cases employing the output taps of the pseudo random signal generation circuit of FIG. 26, the output taps of pseudo random signal generation circuit of FIG. 27, and only the output tap of the final stage D flip-flop $DFF_7$.
Figure 28:
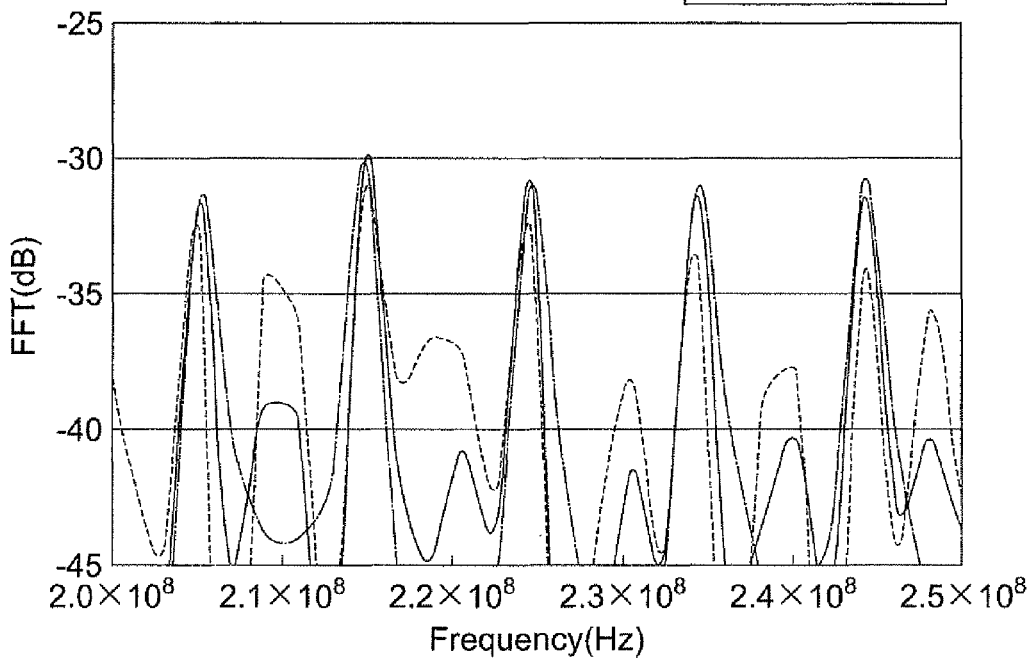

FIG. 28 is a graph showing FFTs performed on each of the output waveforms from the pseudo random signal generation circuit (tap 13579), the pseudo random signal generation circuit (tap56789), and the pseudo random signal generation circuit (tap9).

It is clear from FIG. 28, by looking in the vicinity of 205, 215, 225, 235 and 245 MHz, that pseudo random signal generation circuit (tap13579) has a greater reduction effect on the radiation noise than that of the pseudo random signal generation circuit (tap56789).

Accordingly, noise radiation is reduced by configuring such that terminals of adjacent D flip-flop are not selected in succession by the selection signal, for example, such that selection is every k$^{th}$ D flip-flop (where k is an integer of 2 or greater). Note that the tap position may be determined according to following Equation (1).

$$T_{i+1} = T_i + N/M \quad (1)$$

Wherein T indicates the tap position. The D flip-flops from the first stage to the final stage are indicated by the respective numerical values 1, 2, 3 and so on, and i is a serial number to discriminate between the respective tap positions, and is an integer from 0 to n−1. Note that decimal places in N/M are rounded up. Also, $T_0=1$ is set as the initial value. Accordingly, the D flip-flop of the first stage is selected as an output tap position.

When N=7 and M=4, since N/M (with rounding up of decimals) is 2:

$T_0=1$ $T_1=T_0+2=3$ $T_2=T_1+2=5$ $T_3=T_2+2=7$ and therefore configuration may be made with the 1$^{st}$, 3$^{rd}$, 5$^{th}$ and 7$^{th}$ D flip-flops as tap positions.

When N=9 and M=5, since N/M (with rounding up of decimals) is 2:

$T_0=1$ $T_1=T_0+2=3$ $T_2=T_1+2=5$ $T_3=T_2+2=7$ $T_4=T_3+2=9$ and therefore configuration may be made with the 1$^{st}$, 3$^{rd}$, 5$^{th}$, 7$^{th}$ and 9$^{th}$ D flip-flops as tap positions.

Other Exemplary Embodiments

Various exemplary embodiments are explained above, however the present invention is not limited thereto.

For example, while N may be an integer of 2 or above, according to standards recommended by the International Telecommunication Union (ITU)-T, conventional pseudo random signals are generated for N=7, 9, 11, 15, 23 by pattern signal output circuits as represented by the following polynomial equations.

$$\text{PRBS } 2^7 - 1 = 1 + X^6 + X^7 \quad (1)$$

$$\text{PRBS } 2^9 - 1 = 1 + X^5 + X^9 \quad (2)$$

$$\text{PRBS } 2^{11} - 1 = 1 + X^9 + X^{11} \quad (3)$$

$$\text{PRBS } 2^{15} - 1 = 1 + X^{14} + X^{15} \quad (4)$$

$$\text{PRBS } 2^{23} - 1 = 1 + X^{18} + X^{23} \quad (5)$$

(1) above represents a pattern signal output circuit configured by 7 stages of D flip-flops. Specifically, in (1), the circuit generating a 127 bit pseudo random signal (PRBS 2$^7$−1) is a configuration that feeds back the output signals of the 6$^{th}$ stage flip-flop (X$^6$) and the 7$^{th}$ stage flip-flop (X$^7$) to the first stage D flip-flop through an exclusive-OR circuit. (2) above represents a pattern signal output circuit configured by 9 stages of D flip-flops. Specifically, in (2), the circuit generating a 511 bit pseudo random signal (PRBS 2$^9$−1) is a configuration that feeds back the output signals of the 5$^{th}$ stage flip-flop (X$^5$) and the 9$^{th}$ stage flip-flop (X$^9$) to the first stage D flip-flop through an exclusive-OR circuit. Similarly, (3) represents a pattern signal output circuit configured with 11 stages of D flip-flops, (4) with 15 stages, and (5) with 23 stages.

Note that, (1) corresponds to the configuration of the pattern signal output circuit 10 of the first and second exemplary embodiments, and (2) corresponds to the pattern signal output circuit 10B of the third exemplary embodiment. However, exemplary embodiments of the present invention may be configured with the pattern signal output circuit 10 as shown in (3), (4) and (5).

Furthermore, the tap positions for feeding back to the D flip-flop of the first stage through the exclusive-OR circuit are not limited to the above (1) to (5). For example, other polynomial equations are possible for a 127 bit pseudo random signal shown in (1), such as:

$$\text{PRBS } 2^7 - 1 = 1 + X^1 + X^7 \quad (1a)$$

$$\text{PRBS } 2^7 - 1 = 1 + X^3 + X^7 \quad (1b)$$

$$\text{PRBS } 2^7 - 1 = 1 + X^4 + X^7 \quad (1c)$$

Configuration of the pattern signal output circuit 10 may be as represented by these equations. Similar applies to (2) to (5).

Also applying to cases where the pseudo random signal generation circuit 41 is configured utilizing these pattern signal output circuits is that, as stated above, in alternative exemplary embodiment, configuration may be made such that terminals of adjacent D flip-flops are not selected in succession by the selection signal. Or, in a further exemplary embodiment, configuration may be made such that an inverting terminal and a non-inverting terminal of the D flip-flops are alternately selected according to the selection signal.

The tap position may be set in a single circuit, or a single or plural of the same circuit may be provided and tab positions selected therefrom. For example, in FIG. 8, an example is explained of a configuration in which a single circuit (the pattern signal output circuit 10A) that is the same as the pattern signal output circuit 10 was added. However, in an alternative exemplary embodiment, plural circuits the same as the pattern signal output circuit 10 are provided, and configuration is made such that signals are selected out of the inverting terminals/Q and non-inverting terminals Q of the D respective flip-flops in whichever circuit.

In the first and the second exemplary embodiments described above, an example is explained in which the signal expressing the bit pattern length is output every time high level signals are output from all of the non-inverting terminals Q of the D flip-flops $DFF_1$ to $DFF_7$ of the pattern signal output circuit 10. However, in an alternative exemplary embodiment, configuration may be made such that the signal expressing the bit pattern length is output every time low level signals are output from all of the non-inverting terminals Q of the D flip-flops $DFF_1$ to $DFF_7$. In such cases, each of the respective non-inverting terminals Q of the D flip-flops $DFF_1$ to $DFF_7$ may be connected through inverter circuits to each of the AND circuits $AND_1$, $AND_2$ similarly to described above. Similar applies to the third exemplary embodiment.

In the first and the second exemplary embodiments, examples are explained in which the non-inverting terminals Q of the D flip-flops $DFF_1$ to $DFF_7$ are employed for outputting the signal expressing the bit pattern length. However, in an alternative exemplary embodiment, configuration may be in which the signals output from the inverting terminals/Q of the D flip-flops $DFF_1$ to $DFF_7$ are input to a bit pattern length counting circuit, so as to output the signal expressing the bit pattern length. Namely, during a period when 127 bits worth of signal is output from the non-inverting terminal Q of the final stage D flip-flop $DFF_7$, the 127 combinations of states, for each of the non-inverting terminals Q of the D flip-flops $DFF_1$ to $DFF_7$, changes every time a signal of 1 bit is output from the non-inverting terminals Q of each of the non-inverting terminals Q of the D flip-flops $DFF_1$ to $DFF_7$. Hence, in a different exemplary embodiment, any one state out of the 127 combinations can be employed to output the signal expressing the bit pattern length. Similar applies to the third exemplary embodiment.

In the exemplary embodiments explained above, explanation has been given of an example of cases where, in the normal mode, serial communication is performed for image data from a main controller to an image forming apparatus. However, application may be made to a transmission device for serial transmission of any type of data, in place of image data, and application may be made to a communication system of a transmission device and a reception device that receives and processes the serially transmitted data. The present invention is not limited to the exemplary embodiments described above.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A pseudo random signal generation circuit comprising:
   at least one pattern signal output circuit that includes N stages of D flip-flops, wherein N is an integer of 2 or more, the non-inverting terminal of previous stage D flip-flop is connected to the input terminal of the following stage D flip-flop, the non-inverting terminal of final stage D flip-flop and the non-inverting terminal of the D flip-flop of a stage other than the final stage are connected to the input terminal of the first stage D flip-flop through an exclusive-OR circuit, and that outputs a pattern signal repeating bit patterns of $2^N-1$ bits from the non-inverting terminal of the final stage D flip-flop;
   a signal output circuit that outputs a signal expressing the bit pattern length every time $2^N-1$ bits of the pattern signal are output;
   a selection signal output circuit that, based on the signal expressing the bit pattern length, outputs a selection signal for repeatedly selecting a plurality of terminals, from a plurality of terminals including the non-inverting terminals and the inverting terminals of the pattern signal output circuit, a plurality of terminals at a time; and
   an output circuit that selects the signals output from the plurality of terminals according to the selection signal, and outputs the selected signal as a pseudo random signal.

2. The pseudo random signal generation circuit of claim 1, configured such that, when the plurality of terminals selected according to the selection signal is 3 terminals or more, terminals of adjacent of the D flip-flops are not selected in succession.

3. The pseudo random signal generation circuit of claim 1, configured such that an inverting terminal and a non-inverting terminal of the D flip-flops are alternately selected according to the selection signal.

4. A communication system comprising:
   a transmission device comprising,
      the pseudo random signal generation circuit of claim 1 that outputs the pseudo random signal during test operation, and
      a normal operation transmission circuit that transmits a serial signal during normal operation; and
   a reception device comprising,
      a determination circuit that receives the pseudo random signal transmitted from the transmission device during the test operation, and that determines the signal transmission state based on the received pseudo random signal, and
      a normal operation reception circuit that receives the serial signal from the transmission device during normal operation.

5. An image forming system, comprising:
   an image data transmission device comprising,
      the pseudo random signal generation circuit of claim 1 that outputs the pseudo random signal during test operation, and
      a normal operation transmission circuit that transmits a serial signal including image data during normal operation; and
   an image forming apparatus comprising,
      a determination circuit that receives the pseudo random signal transmitted from the transmission device during the test operation, and that determines the signal transmission state based on the received pseudo random signal,
      a normal operation reception circuit that receives the serial signal including the image data from the transmission device during normal operation, and
      an image forming section that forms an image based on the image data.

6. A pseudo random signal generation circuit comprising:
   a pattern signal output circuit that includes N stages of D flip-flops, wherein N is an integer of 2 or more, the non-inverting terminal of previous stage D flip-flop is connected to the input terminal of following stage D flip-flop, the non-inverting terminal of final stage D flip-flop and the non-inverting terminal of the D flip-flop of a stage other than the final stage are connected to the input terminal of the first stage D flip-flop through an exclusive-OR circuit, and that outputs a pattern signal repeating bit patterns of $2^N-1$ bits from the non-inverting terminal of the final stage D flip-flop;

a signal output circuit, connected to each of the non-inverting terminals or each of the inverting terminals of the D flip-flops of the pattern signal output circuit, that outputs a signal expressing the bit pattern length every time $2^N-1$ bits of the pattern signal are output;

a selection signal output circuit, provided with M individual output terminals, wherein M is less than 2N and is an integer of 2 or more, that counts the signal expressing the bit pattern length, and that outputs one or other selection signal every count, such that the selection signals of different M individual terminals are repeatedly output M individual terminals at a time; and an output circuit that, according to the selection signal, selects the signal output from the non-inverting terminal of the final stage D flip-flop of the pattern signal output circuit, or the signal output from one or other of the non-inverting terminals of the M−1 D flip-flops other than the D flip-flop of the final stage, or the signal output from the inverting terminal of one or other of the M−1 D flip-flops, and outputs the selected signal as a pseudo random signal.

7. The pseudo random signal generation circuit of claim 6, wherein the output circuit comprises:

M individual AND circuits, connected such that one or other of the M selection signals is input to each of the M individual AND circuits together with one or other of either, the signal output from the non-inverting terminal of the final stage D flip-flop of the pattern signal output circuit, or the signal output from the non-inverting terminal or the inverting terminal of one or other of the M−1 individual D flip-flops other than the final stage D flip-flop of the pattern signal output circuit; and an OR circuit connected to be input with the signals output from the M individual AND circuits, and that outputs the signals output from the M individual AND circuits at the pseudo random signal.

8. The pseudo random signal generation circuit of claim 6, configured such that, when a plurality of terminals selected according to the selection signal is 3 terminals or more, terminals of adjacent of the D flip-flops are not selected in succession.

9. The pseudo random signal generation circuit of claim 6, configured such that an inverting terminal and a non-inverting terminal of the D flip-flops are alternately selected according to the selection signal.

10. A communication system comprising:
a transmission device comprising,
the pseudo random signal generation circuit of claim 6 that outputs the pseudo random signal during test operation, and
a normal operation transmission circuit that transmits a serial signal during normal operation; and
a reception device comprising,
a determination circuit that receives the pseudo random signal transmitted from the transmission device during the test operation, and that determines the signal transmission state based on the received pseudo random signal, and
a normal operation reception circuit that receives the serial signal from the transmission device during normal operation.

11. An image forming system comprising:
an image data transmission device comprising,
the pseudo random signal generation circuit of claim 6 that outputs the pseudo random signal during test operation, and
a normal operation transmission circuit that transmits a serial signal including image data during normal operation; and
an image forming apparatus comprising,
a determination circuit that receives the pseudo random signal transmitted from the transmission device during the test operation, and that determines the signal transmission state based on the received pseudo random signal,
a normal operation reception circuit that receives the serial signal including the image data from the transmission device during normal operation, and
an image forming section that forms an image based on the image data.

* * * * *